(12) United States Patent
Bretthauer et al.

(10) Patent No.: US 12,075,212 B2
(45) Date of Patent: Aug. 27, 2024

(54) METHOD OF ELECTRICAL TRIMMING OF SENSITIVITY AND FREQUENCY RESPONSE FOR PIEZOELECTRIC MEMS

(71) Applicant: Infineon Technologies AG, Neubiberg (DE)

(72) Inventors: Christian Bretthauer, Munich (DE); Andreas Bogner, Munich (DE); Gabriele Bosetti, Munich (DE); Niccoló De Milleri, Villach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 18/162,212

(22) Filed: Jan. 31, 2023

(65) Prior Publication Data

US 2023/0262397 A1    Aug. 17, 2023

(30) Foreign Application Priority Data

Feb. 16, 2022   (EP) .................................... 22157127

(51) Int. Cl.
| | |
|---|---|
| *H04R 17/10* | (2006.01) |
| *B81B 7/00* | (2006.01) |
| *H04R 3/00* | (2006.01) |
| *H04R 7/06* | (2006.01) |
| *H04R 17/02* | (2006.01) |

(52) U.S. Cl.
CPC ............. *H04R 17/10* (2013.01); *B81B 7/008* (2013.01); *H04R 3/00* (2013.01); *H04R 7/06* (2013.01); *H04R 17/02* (2013.01); *B81B 2201/0257* (2013.01); *B81B 2203/0127* (2013.01); *B81B 2207/03* (2013.01); *H04R 2201/003* (2013.01)

(58) Field of Classification Search
CPC . H04R 17/10; H04R 3/00; H04R 7/06; H04R 17/02; H04R 2201/003; B81B 7/008; B81B 2201/0257; B81B 2203/0127; B81B 2207/03
See application file for complete search history.

(56) References Cited

U.S. PATENT DOCUMENTS

| | | | |
|---|---|---|---|
| 8,686,802 B1* | 4/2014 | Brown | H03B 5/30 333/186 |
| 10,284,960 B2 | 5/2019 | Grosh et al. | |
| 10,626,007 B2 | 4/2020 | Bretthauer et al. | |
| 2003/0127944 A1* | 7/2003 | Clark | H03H 9/172 310/316.01 |
| 2011/0025426 A1* | 2/2011 | Steeneken | H03B 5/30 331/155 |
| 2011/0169374 A1* | 7/2011 | Engel | H10N 30/50 310/314 |

(Continued)

OTHER PUBLICATIONS

Nastro et al., Piezoelectric Micromachined Acoustic Transducer with Electrically Tunable resonant frequency (Year: 2019).*

*Primary Examiner* — Carolyn R Edwards
*Assistant Examiner* — Kuassi A Ganmavo
(74) *Attorney, Agent, or Firm* — Slater Matsil, LLP

(57) ABSTRACT

A Micro-Electro-Mechanical System (MEMS) device comprises a piezoelectric transducer having a first frequency behavior, wherein the piezoelectric transducer comprises a piezoelectric trimming region, and control circuitry to provide a bias signal to the piezoelectric trimming region of the piezoelectric transducer for adjusting a second frequency behavior of the piezoelectric transducer.

20 Claims, 16 Drawing Sheets

(56) References Cited

U.S. PATENT DOCUMENTS

| | | | |
|---|---|---|---|
| 2012/0206996 A1* | 8/2012 | Ballandras | H03H 9/205 367/2 |
| 2014/0085020 A1* | 3/2014 | Reinhardt | H03H 3/04 333/188 |
| 2015/0350792 A1* | 12/2015 | Grosh | H10N 30/306 257/416 |
| 2017/0201192 A1* | 7/2017 | Tumpold | H02N 1/006 |
| 2018/0035229 A1* | 2/2018 | Deas | H04R 31/006 |
| 2019/0006136 A1* | 1/2019 | Rinaldi | H01H 37/10 |
| 2019/0016588 A1* | 1/2019 | Bretthauer | H04R 19/005 |
| 2019/0289405 A1 | 9/2019 | Littrell et al. | |
| 2021/0385584 A1 | 12/2021 | Goswami et al. | |

\* cited by examiner

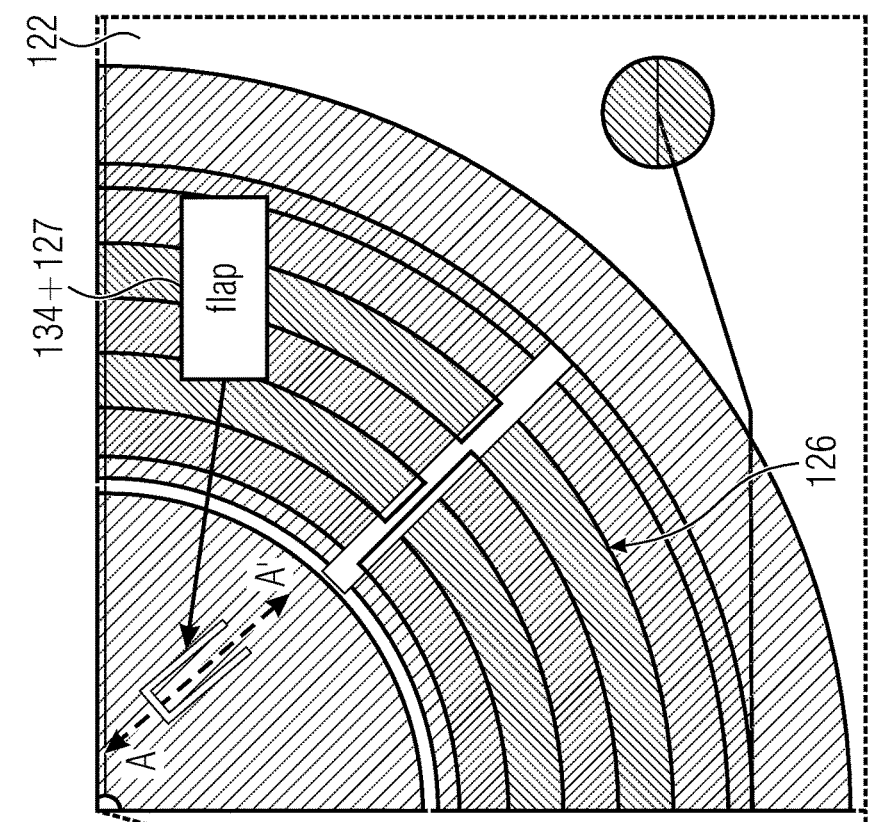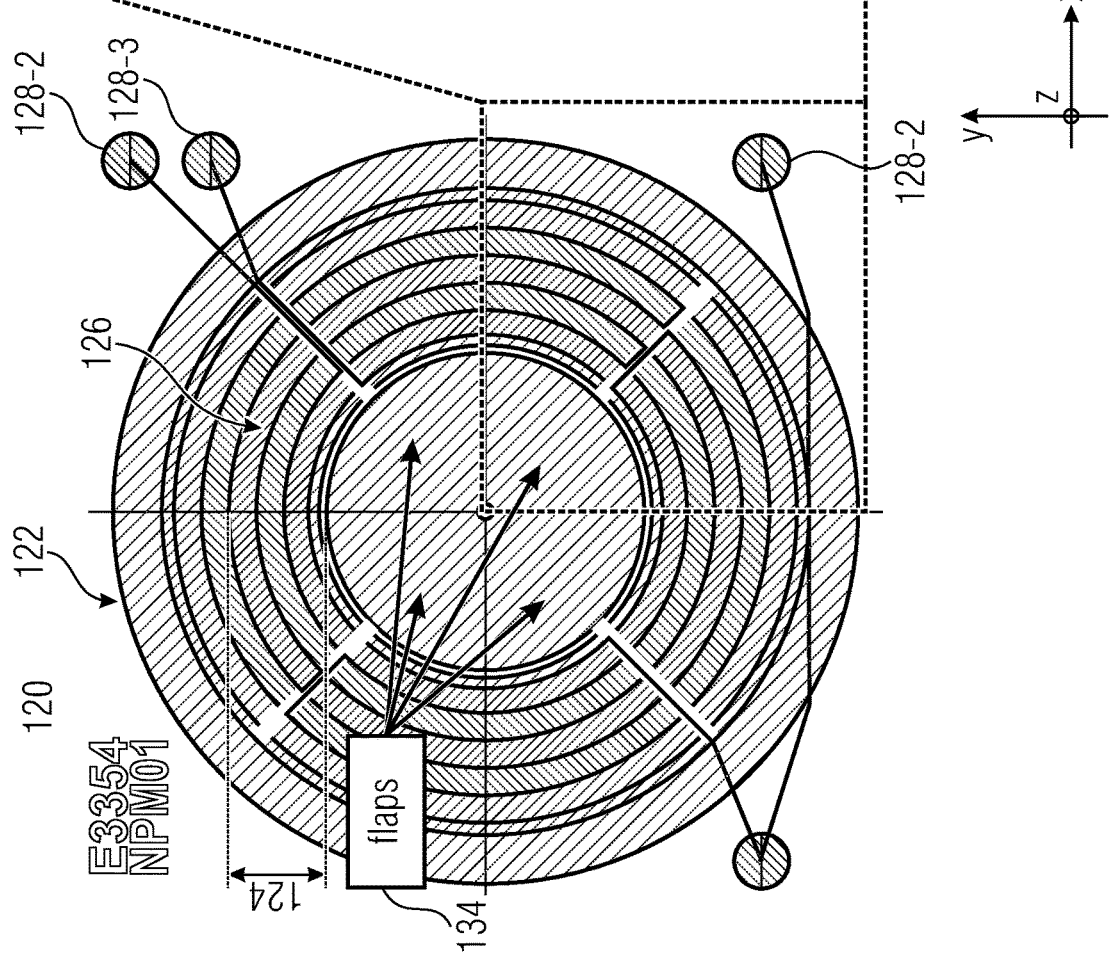
Fig. 6b
Fig. 6a

METHOD OF ELECTRICAL TRIMMING OF SENSITIVITY AND FREQUENCY RESPONSE FOR PIEZOELECTRIC MEMS

This application claims the benefit of European Patent Application No. 22157127, filed on Feb. 16, 2022, which application is hereby incorporated herein by reference.

TECHNICAL FIELD

Embodiments of the present disclosure relate to a MEMS device (MEMS=micro-electro-mechanical system), such as a MEMS device having a piezoelectric transducer. More specifically, embodiments relate to a MEMS device having a piezoelectric transducer in form of an actuator or sensor, such as a piezoelectric MEMS loudspeaker, a piezoelectric MEMS pressure sensor or a piezoelectric MEMS microphone. In particular, embodiments relate to a concept (=method or apparatus) for electrically trimming the sensitivity and/or frequency response of piezoelectric MEMS devices.

BACKGROUND

Piezoelectric MEMS devices may be implemented as MEMS sound transducers in form of MEMS microphones or MEMS loudspeakers, for example, MEMS microphones are used for recording ambient sound or ambient noise. MEMS loudspeakers are used for emitting acoustic or ultrasonic sound to the environment. MEMS sound transducers have a frequently still considerable variation in the frequency response, for example owing to process variations during manufacture or to package variations or, potentially, to ambient in-fluences during operation of the sound transducer.

Thus, due to process variations, the frequency response, e.g. the sensitivity, the low-frequency roll-off (LFRO) and/or the resonance of a piezoelectric MEMS device, can vary considerably. In the case of piezoelectric MEMS sound transducers, a tight trimming of the sensor sensitivity and frequency response is often mandatory for the products.

Moreover, a structure pre-bending due to material pre-stress can lead to an uncontrolled and inconsistent LFRO among piezoelectric MEMS devices of the same type.

FIG. 9 shows a graph depicting the sensitivity of different MEMS devices (samples 1-5) as a function of the frequency of the output/input signal of the piezoelectric MEMS device. Thus, piezoelectric MEMS devices are subject to a considerable LFRO variation (LFRO=low frequency roll-off) of its sensitivity and resonance behavior, e.g. the resonance frequency.

An ASIC (ASIC=Application Specific Integrated Circuit) connected to these MEMS devices usually contains a programmable gain amplifier (PGA) that is used to trim the sensitivity e.g. at a frequency of 1 kHz, to a desired target value, e.g. a sensitivity target value. The PGA, however, has a considerable impact on the resulting system noise, so that the sensitivity can be trimmed to the desired target value, however, with a negative impact on the noise behavior, i.e. on the SNR (SNR=signal-to-noise ratio). Moreover, trimming the sensitivity to the desired target value fails to help to control the resonance behavior, e.g. the resonance frequencies, or the LFRO of the piezoelectric MEMS device.

Therefore, there is a need in the field of piezoelectric MEMS devices for electrically trimming the sensitivity and frequency response of MEMS devices having a piezoelectric transducer.

Such a need can be solved by the MEMS device according to independent claim 1.

Further, specific implementations of the MEMS device are defined in the dependent claims.

SUMMARY

According to an embodiment, a MEMS device comprises a piezoelectric transducer (actuator or sensor) having a first frequency behavior, wherein the piezoelectric transducer comprises a piezoelectric trimming region, and a control circuitry configured to provide a bias signal to the piezoelectric trimming region of the piezoelectric transducer for adjusting a second frequency behavior (a target behavior) of the piezoelectric transducer.

According to an embodiment of the MEMS device, the piezoelectric transducer comprises a (first) piezoelectric transducing element (e.g., a piezoelectric layer), wherein at least a part of the (first) piezoelectric transducing element forms the piezoelectric trimming region.

According to an embodiment of the MEMS device, the piezoelectric transducer comprises a (first) piezoelectric transducing element (e.g., a piezoelectric layer) and a further (second) piezoelectric transducing element, wherein the further (second) piezoelectric transducing element forms the piezoelectric trimming region.

The (first) piezoelectric transducing element and the further (second) piezoelectric transducing element may be formed as separate piezoelectric transducing elements. The term "separate" piezoelectric transducing elements relates to the embodiments which describe an "additional" trimming electrode, i.e. the further (second) piezoelectric transducing element (e.g., as an external trimming ring or an internal trimming electrode). The additional piezoelectric transducing element (=trimming electrode) comprises its own terminals which are electrically separated from the terminals of the first piezoelectric transducing element. Thus, the first piezoelectric transducing element and the second piezoelectric transducing element can be separately (=independently) operated, e.g. driven (=signal supplied) and/or read-out (=signal sensed).

Thus, the (first) piezoelectric transducing element and the further (second) piezoelectric transducing element may formed as electrically and/or spatially separated (=independent) piezoelectric transducing elements.

Thus, exemplary embodiments of the present disclosure provide different approaches to trim the frequency response of piezoelectric MEMS devices. Thus, the frequency response e.g., in form of the sensitivity, the LFRO, the resonance frequency (resonance behavior), the total harmonic distortion (THD) and/or the acoustic overload point (AOP) of the MEMS device having a piezoelectric transducer can be individually trimmed, e.g. during a final product test or even during the (ongoing) operation of the piezoelectric MEMS device, e.g. in response to instantaneous environmental conditions. Thus, according to the described embodiment, piezoelectric MEMS devices can be individually trimmed to meet a tight target specification.

According to exemplary embodiments of the MEMS device, a bias signal (e.g., a bias voltage) is used, for example in addition to the PGA, to trim the frequency behavior of the piezoelectric transducer of the MEMS device without impacting the resulting SNR.

BRIEF DESCRIPTION OF THE DRAWINGS

In the following, embodiments of the present disclosure are described in more detail with respect to the figures, in which:

FIGS. 6a-6c show an exemplary schematic illustration of a MEMS device according to a further embodiment;

Figure 1A:
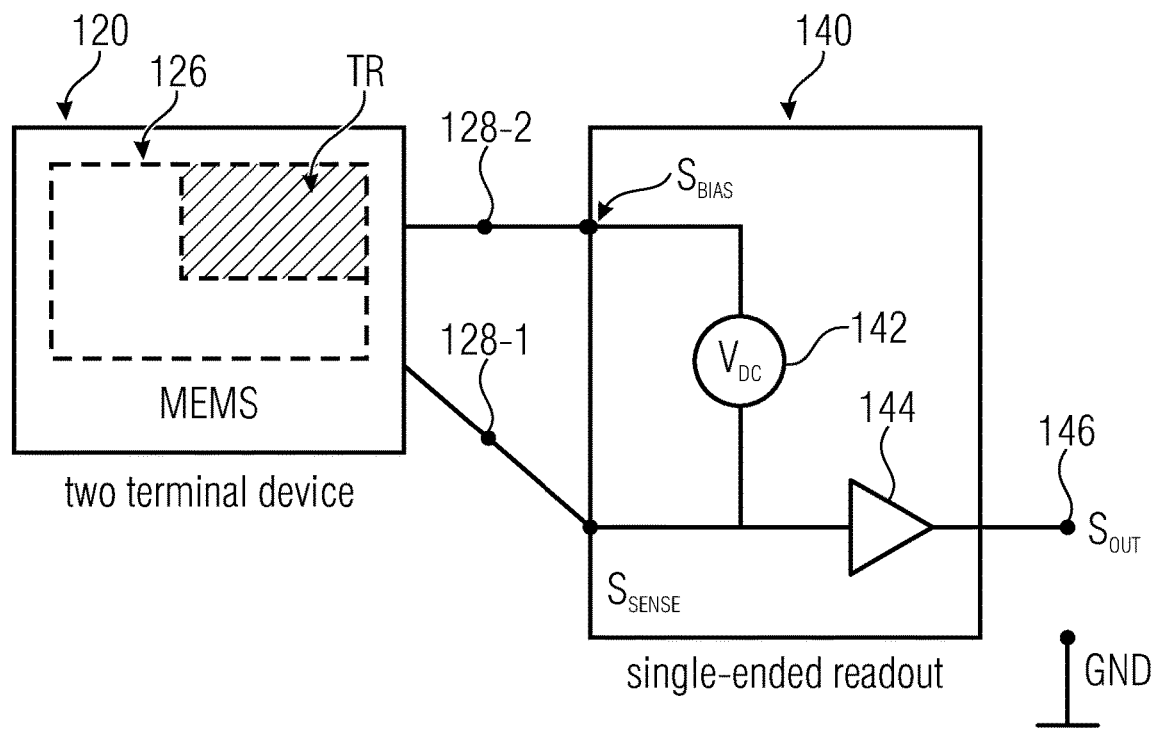
FIGS. 1a-1b show an exemplary schematic illustration of the MEMS device according to an embodiment.

In the following description, embodiments are discussed in further detail using the figures, wherein in the figures and the specification identical elements and elements having the same functionality and/or the same technical or physical effect are provided with the same reference numbers or are identified with the same name. Thus, the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

In the description of the embodiments, terms and text passages placed in brackets are to be understood as further explanations, exemplary configurations, exemplary additions and/or exemplary alternatives.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, some of the figures comprise a Cartesian coordinate system x, y, z, wherein the x-y-plane corresponds, i.e. is parallel, to a main surface region (e.g., a displaceable or deflectable membrane) of a piezoelectric transducer (=a reference plane=x-y-plane), wherein the direction vertically up with respect to the reference plane (x-y-plane) corresponds to the "+z" direction, and wherein the direction vertically down with respect to the reference plane (x-y-plane) corresponds to the "−z" direction. In the following description, the term "lateral" means a direction parallel to the x- and/or y-direction or a direction parallel to (or in) the x-y-plane, wherein the term "vertical" means a direction parallel to the z-direction.

In the following, the principle structure (setup) and functionality of a MEMS device 100 according to an embodiment are described based on FIGS. 1a-1c.

Figure 1B:
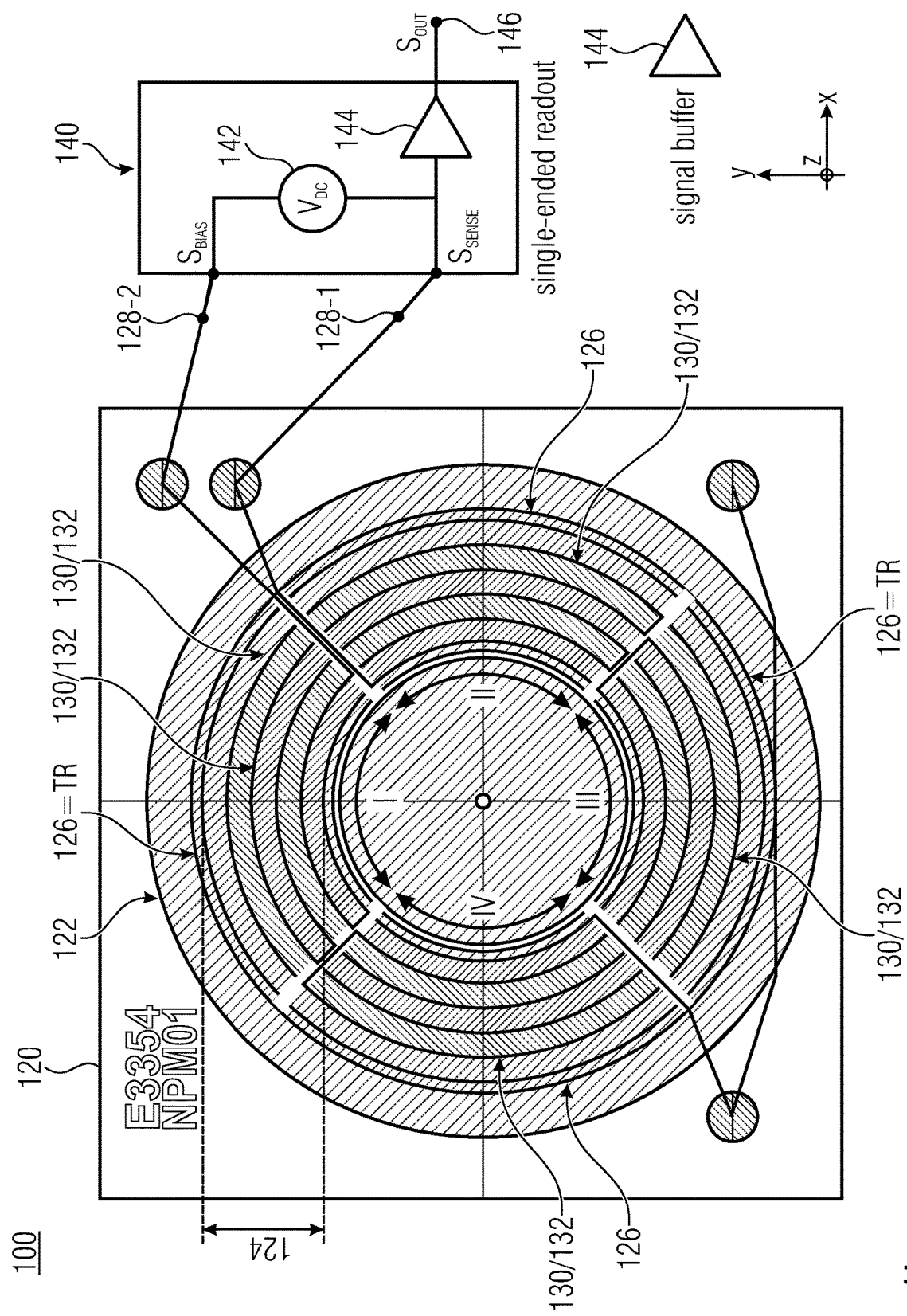

FIGS. 1a-1b show an exemplary schematic illustration of the MEMS device 100 having a piezoelectric transducer 120, e.g. a two terminal piezoelectric device, and a control circuitry 140 (with a biasing and read-out function) according to an embodiment. The control circuitry 140 may be an ASIC (ASIC=application specific integrated circuit), a part of an ASIC or a stand-alone circuit.

Figure 1C:
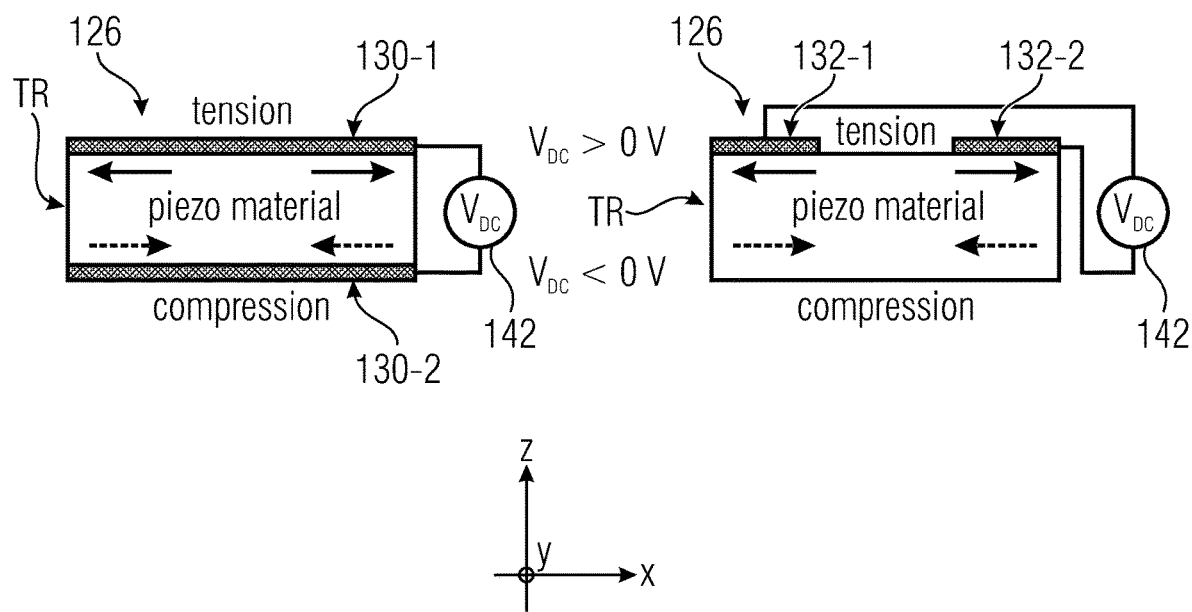
FIG. 1c shows a schematic cross-sectional view of the biasing conditions of a piezoelectric trimming region of the piezoelectric transducer of the MEMS device according to an embodiment.

According to the embodiment of FIGS. 1a-1c, the MEMS device 100 comprises the piezoelectric transducer 120, e.g. in form of an actuator (e.g., a loudspeaker) or a sensor (e.g., a microphone), having a first frequency behavior, wherein the piezoelectric transducer 120 comprises a piezoelectric trimming region TR. Further, the MEMS device 100 comprises a control circuitry 140 configured to provide a bias signal $S_{BIAS}$, e.g. a bias voltage $V_{DC}$, to the piezoelectric trimming region TR of the piezoelectric transducer 120 for adjusting a second frequency behavior (target behavior) of the piezoelectric transducer 120.

According to the embodiment of the MEMS device 100, the piezoelectric transducer 120 comprises a (first) piezoelectric transducing element 126, e.g. in form of a piezoelectric layer or structure, wherein at least a part of the (first) piezoelectric transducing element 126 or the complete (first) piezoelectric transducing element 126 forms the piezoelectric trimming region TR.

As exemplarily shown in FIGS. 1a-1b, the piezoelectric transducer 120 may be implemented as a two terminal piezoelectric device having a first terminal (contact or pad) 128-1, e.g. a sense or control terminal, and a second terminal (contact or pad) 128-2, e.g. a bias terminal. During a sensor operation of the piezoelectric transducer 120, the first terminal 128-1 forms a sense terminal for outputting the sense signal $S_{SENSE}$ During an actuator operation of the piezoelectric transducer 120, the first terminal 128-1 forms a drive terminal for receiving a drive signal, for example (e.g., see also FIGS. 3a-3b and the associated description below).

Thus, FIG. 1a shows a schematic equivalent circuit of the MEMS device 100 having the piezoelectric MEMS transducer 120 and the control circuitry 140, wherein FIG. 1b shows an exemplary technical implementation of the piezoelectric MEMS transducer 120. As exemplarily shown in FIG. 1b, the piezoelectric MEMS transducer 120 may have a membrane structure 122, the piezoelectric (layer) structure 126 and the contact structures (contact layers) 130, 132 which are connected to contact regions (or pads) 128-1, 128-2. Thus, the piezoelectric transducer 120 has a membrane structure 122, wherein the piezoelectric transducing element 126 is fixed (e.g., mechanically coupled or attached) to or forms the membrane structure 122, Thus, the membrane structure 122 may comprise (may be made) at least partially or completely (of) piezoelectric material. The membrane structure 122 may comprise, for example, a corrugated membrane region 124, wherein the piezoelectric (layer) structure 126 and the contact structures (contact layers) 130, 132 are fixed (=mechanically coupled or attached) to or form the membrane structure 122, e.g. to the corrugated membrane region 124 of the membrane structure 122.

According to an embodiment, the membrane structure 122 may comprise a diaphragm (e.g., having a metallic, plastic, insulating or semiconductor material, e.g. poly-Si, etc.), wherein the piezoelectric transducing element 126 is fixed (e.g., mechanically coupled or attached) to the diaphragm. According to a further embodiment, the piezoelectric transducing element 126 itself may form the membrane structure 122, wherein the membrane structure 122 may consist of or may comprise the piezoelectric material of the piezoelectric transducing element 126.

The contact regions 128-1, 128-2 provide for electrical contacts and connections from the contact structures (contact layers) 130, 132 (see e.g., FIG. 1c) of the piezoelectric (layer) structure 126 to the control circuitry 140 of the MEMS device 100. As shown in FIGS. 1a-1b, the control circuitry 140 is configured to read out the sense signal $S_{SENSE}$ from the piezoelectric MEMS transducer 120 at the first terminal 128-1 and to provide the bias signal $S_{BIAS}$ at the second terminal 128-2 to the piezoelectric MEMS transducer 120.

According to an embodiment, the piezoelectric layer or structure 126 may partially or completely cover a main surface region (e.g., front or back side) of the membrane structure 122, wherein the electrodes (or terminals) 130, 132 cover partially or completely the piezoelectric layer or structure 126. The electrodes (or terminals) 130, 132 may cover (partially or completely) the (active) areas of the piezoelectric layer or structure 126.

As exemplarily shown in FIG. 1b, the piezoelectric MEMS transducer 120 may be segmented, i.e. may comprise a segmented membrane structure 122 having the membrane segments I, II, III, IV and a segmented piezoelectric (layer) structure 126 having accordingly formed piezoelectric structure segments and may comprise a segmented contact structure (contact layer) 130, 132 having accordingly formed contact structure (contact layer) segments, wherein the (e.g., four) segments I, II, III and IV of the piezoelectric MEMS transducer 120 are serially connected. According to a further embodiment, the piezoelectric MEMS transducer 120 may also comprise a continuous (not-segmented or one-piece) structure.

According to an embodiment, the piezoelectric transducer 120 may be implemented as a piezoelectric sensor. The piezoelectric sensor uses the piezoelectric effect to measure changes in pressure, acceleration, temperature, strain, or force by converting them to an electrical charge. The piezoelectric transducer 120 has (usually) a (very) high DC output impedance and can be modeled as a proportional voltage source. The output voltage $S_{SENSE}$ of the piezoelectric sensor 120 is directly proportional to the applied force, pressure, or strain, i.e. to the force, pressure, or strain applied to the displaceable or deflectable membrane structure 122 of the piezoelectric transducer 120.

According to a further embodiment, the piezoelectric transducer 120 may be also implemented as an actuator, e.g. in form of a piezoelectric speaker (loudspeaker or piezo bender due to its mode of operation) that uses the piezoelectric effect for generating sound. The initial mechanical motion is created by applying a voltage to a piezoelectric material, and this motion is typically converted into audible sound or ultrasonic sound using a diaphragm (membrane). When the diaphragm is excited with an alternating voltage and this causes motion of the diaphragm which gives the sound.

FIG. 1c shows a schematic cross-sectional view of an exemplary piezoelectric structure 126 of the piezoelectric transducer 120 and exemplary biasing conditions of the piezoelectric structure 126 according to the embodiment. The piezoelectric transducer 120 of FIGS. 1a-1b is implemented as a piezoelectric sensor, which provides the sensor output signal $S_{SENSE}$ based on a deflection of the membrane structure 122 due to an acoustic or ultra-sonic sound signal or a noise signal received from the environment of the MEMS device 100.

FIG. 1c shows a schematic cross-sectional view of an exemplary trimming region TR of the piezoelectric structure 126 of the piezoelectric transducer 120 and exemplary biasing conditions of the trimming region TR according to the embodiment. Depending on the polarity of the (DC) bias voltage $S_{BIAS}$, different strain conditions (tension or compression) are exerted on the piezoelectric material of the piezoelectric trimming region TR of the piezoelectric transducer 126 which results in different biasing conditions of the piezoelectric trimming region TR of the piezoelectric transducer 126 of the MEMS device 100. Moreover, based on the strength (signal value) of the (DC) bias voltage $S_{BIAS}$, the magnitude and extent of the strain conditions in the piezoelectric material of the piezoelectric trimming region TR of the piezoelectric transducer 126 can be adjusted.

FIG. 1c shows further different implementations of contact structures (contact layers) 130 (=130-1 and 130-2), 132 (=132-1 and 132-2) for the piezoelectric material of the piezoelectric trimming region TR of the piezoelectric transducer 126. As shown in FIG. 1c (left side), the contact structures 130-1, 130-2 may be arranged on different, opposing surfaces (front and back side) of the piezoelectric layer (=piezoelectric trimming region) TR, i.e. the piezoelectric layer TR is sandwiched between the contact structures 130-1, 130-2. As shown in FIG. 1c (right side), the contact structures 132-1, 132-2 may be arranged on the same surface region (e.g., the front or back side) of the piezoelectric layer TR in a laterally spaced and separated arrangement.

Thus, the DC voltage $V_{DC}$ is applied to a specific physical region TR of a piezoelectric MEMS device 120 to trim its mechanical and system properties to a desired target specification.

The control circuitry 140 is connected to the first and second terminal 128-1, 128-2 of the piezoelectric transducer 120, wherein the first terminal 128-1 forms a sense and/or control terminal, and the second terminal 128-2 forms a bias terminal of the piezoelectric transducer 120. The control circuitry 140 comprises a voltage source 142 for providing the bias signal (bias voltage) $S_{BIAS}$ (=$V_{DC}$) to the second terminal 128-2 of the piezoelectric transducer 120, wherein the second terminal 128-2 is connected to the piezoelectric trimming region TR of the piezoelectric transducer 120. The voltage source 142 is connected between the first and second terminal 128-1, 128-2 of the piezoelectric transducer 120. Thus, the control circuitry 140 is configured to adjust the second frequency behavior (=target behavior) of the piezoelectric transducer 120 by providing the bias signal $S_{BIAS}$, e.g. a DC bias voltage $V_{DC}$, to the piezoelectric trimming region TR of the piezoelectric transducer 120.

Further, the first terminal (output terminal) 128-1 of the piezoelectric transducer 120 is connected to a signal buffer 144 of the control circuitry 140 for providing the output signal Sour of the MEMS device 100, e.g. in a single-ended readout configuration, to the output terminal 146. The signal level of the output signal Sour at the output terminal 146 may be related to a reference potential (reference voltage) GND, e.g. ground potential.

The signal buffer or buffer amplifier 144 provides an electrical impedance transformation from the first terminal 128-1 of the piezoelectric transducer 120 to the output terminal 146 of the control circuitry 140 of the MEMS device 100, with the aim of preventing the signal source (=the piezoelectric transducer 120) from being affected by a load at the output terminal 146. Thus, the sense (output) signal $S_{SENSE}$ of the piezoelectric transducer 120 is 'buffered from' the load (or currents produced by the load).

According to the present approach, the piezoelectric MEMS device 100 may be implemented as a piezoelectric MEMS sensor based on inverse piezoelectric effect, wherein the MEMS device 100 uses a bias voltage $S_{BIAS}$ which is applied between the electrodes 128-1, 128-2 of the piezoelectric MEMS transducer 120. The DC voltage applied to the MEMS transducer 120 causes a mechanical reaction in the MEMS transducer 120 (due to the direct piezoelectric effect). When applied to the piezoelectric trimming region TR, the generated strain/stress leads to a deformation or deflection of the MEMS structure 122, e.g. the membrane structure 122. Such a deformation can be used to trim the sensitivity, e.g. by counteracting the impact of material pre-stress hence making the whole structure softer/harder, and/or to trim the frequency response (LFRO and resonance).

Figure 8A:
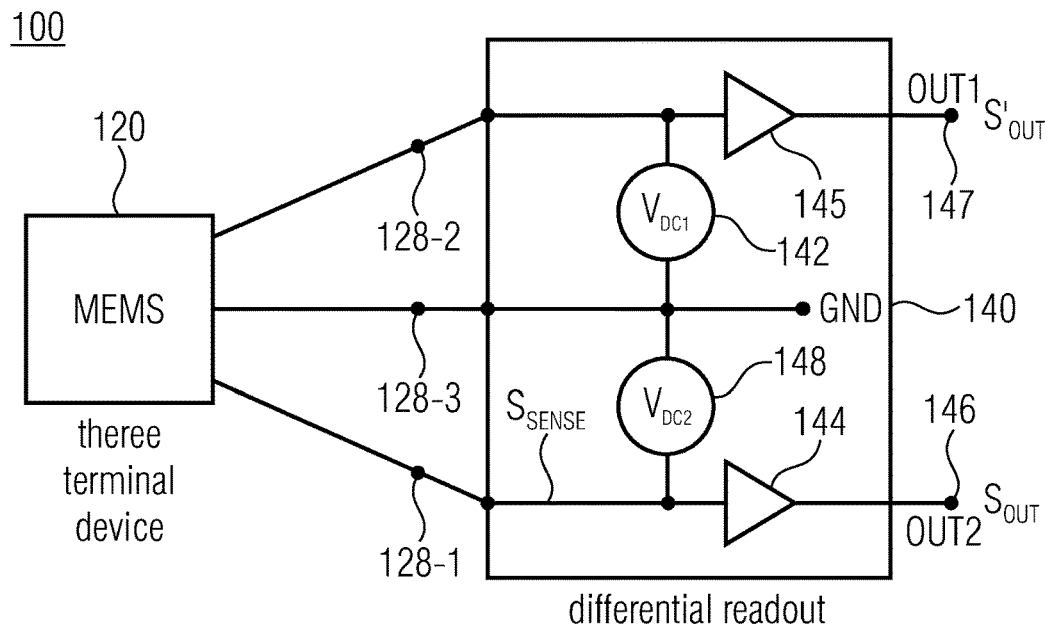
FIGS. 8a-8b show exemplary schematic illustrations of the MEMS device in a differential readout configuration according to embodiments.
Figure 8B:
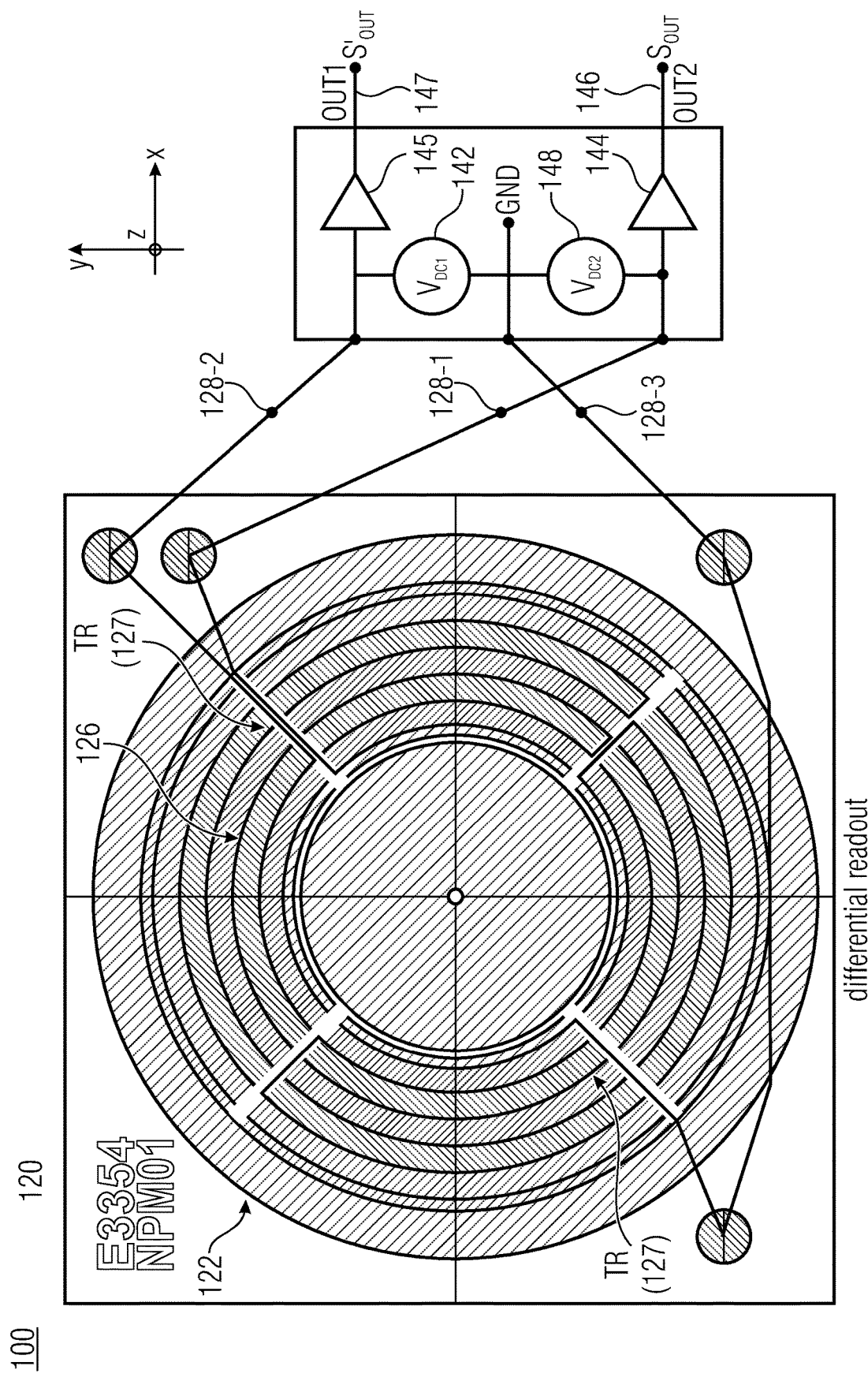
Figure 9:
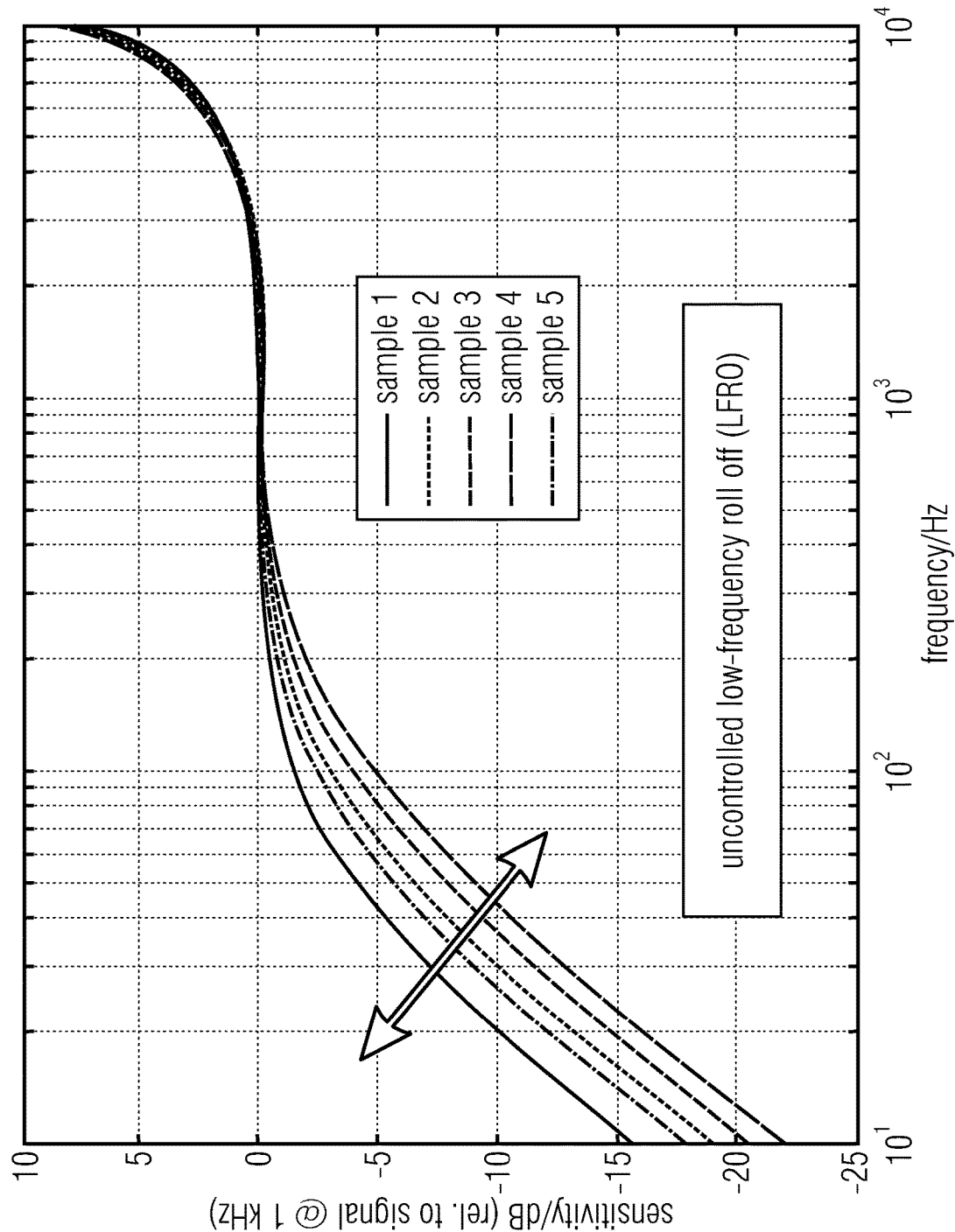
FIG. 9 shows the LFRO (low-frequency roll-off) behavior of different samples (samples 1-5) of a conventional piezoelectric MEMS transducer.

Moreover, LFRO can be adjusted if the device deformation under bias leads to a physical change of the acoustic properties of the system, e.g. a variation of the size of the ventilation hole (see also for example FIGS. 8a-8c and the associated text passages of the description).

Also, the same principle can be exploited to correct for manufacturing variations of a MEMS product in order to meet a defined target specification.

Thus, exemplary embodiments of the present disclosure provide different trimming approaches suitable for piezoelectric MEMS devices during the frequency response of the piezoelectric MEMS device, such as the sensitivity, the LFRO, the resonance frequency (resonance behavior), the total harmonic distortion (THD) and/or the acoustic overload point (AOP) of the piezoelectric transducer 120 of the MEMS device having a piezoelectric transducer can be individually trimmed, e.g. during a final product test or even during the (ongoing) operation of the piezoelectric MEMS device. Thus, according to the described embodiment, piezoelectric MEMS devices can be individually trimmed to meet a tight target specification.

According to embodiments, the described trimming and/or adjusting of the frequency behavior of the piezoelectric MEMS transducer 120 can be used for the initial microphone trimming but also during operation. Alternatively, or additionally, the frequency response of the piezoelectric MEMS device (e.g., the sensitivity, LFRO, resonance behavior, a total harmonic distortion (THD), or the acoustic overload point (AOP)) can be adjusted depending on environmental conditions of the MEMS device 100. In case, the MEMS device is in a very loud or quiet environment, the trimming of the piezoelectric MEMS transducer 120 can be conducted to adapt the frequency response to the respective environmental conditions.

Figure 2:
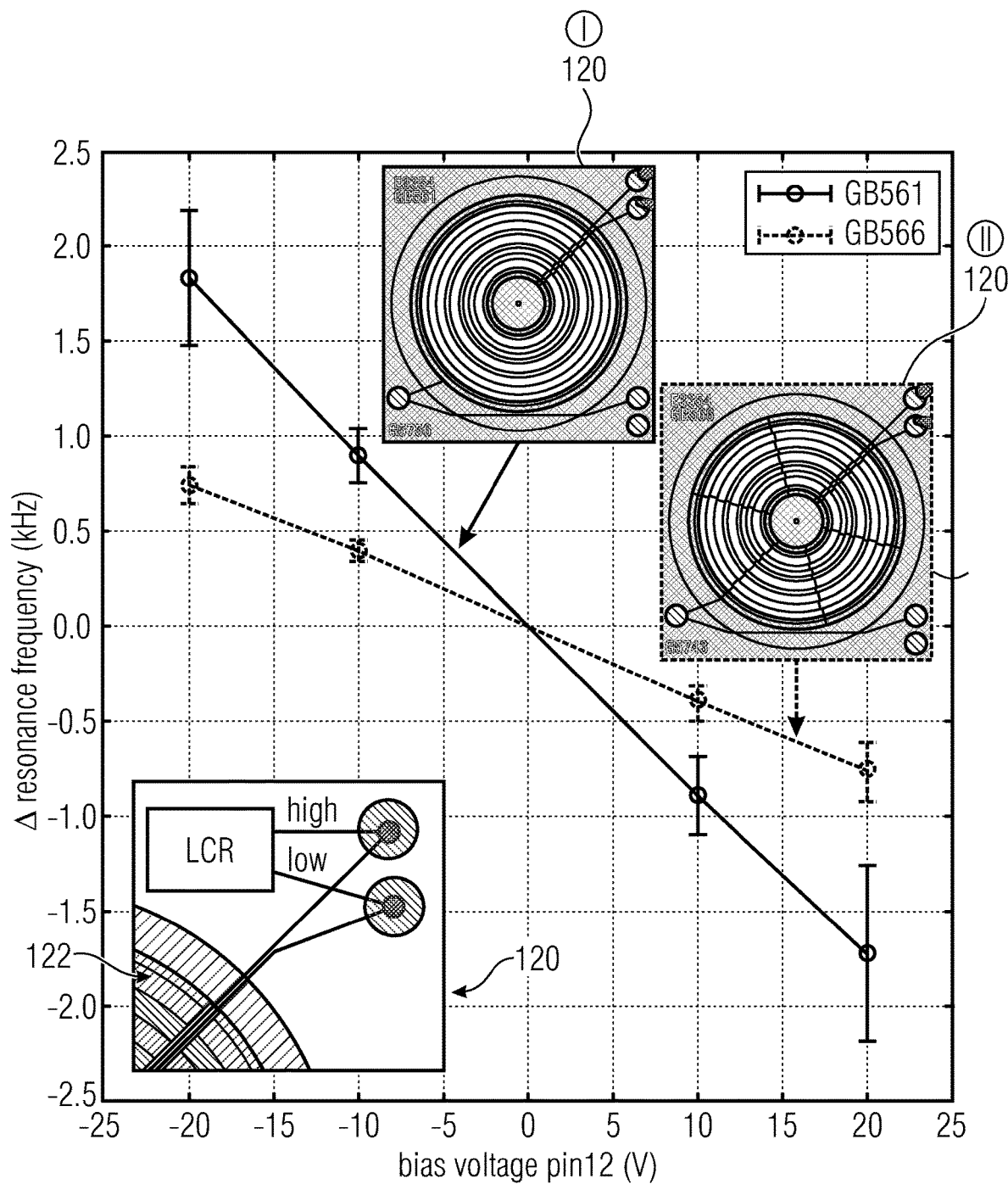
FIG. 2 shows a schematic illustration of a change of a frequency behavior (resonance shift) of the piezoelectric transducer based on the applied bias signal according to an embodiment.

FIG. 2 shows a schematic illustration of a change of a frequency behavior, i.e. a resonance shift, of the piezoelectric transducer 120 based on the applied bias signal SmAs according to an embodiment. The resonance shift is measured by means of an impedance analyzer (LCR), for example. As shown in FIG. 2, the degree or amount of the resonance shift depends on the design of the structure of the piezoelectric MEMS transducer 120. A continuous (not-segmented) piezoelectric MEMS transducer 120 (I) shows a larger dependency of the resonance shift from the bias signal $S_{BIAS}$ than a segmented piezoelectric MEMS transducer 120 (II) having e.g. six serially connected segments.

As shown in FIG. 2, the bias signal $S_{BIAS}$ is applied between the readout pins 128-1, 128-2 (first and second terminals). By applying the bias voltage between the readout pins 128, 122 of the piezoelectric MEMS transducer 120, the target frequency behavior of the piezoelectric MEMS transducer 120 can be adjusted. FIG. 2 shows wafer level resonance shift measurements, wherein also the sensitivity (or the frequency response in general) can be adapted (e.g., an increased sensitivity can be achieved) by means of applying the bias voltage (having the right polarity) between the first and second terminals 128-1, 128-2 (pin 1, pin 2) of the piezoelectric MEMS transducer 120.

Figure 3A:
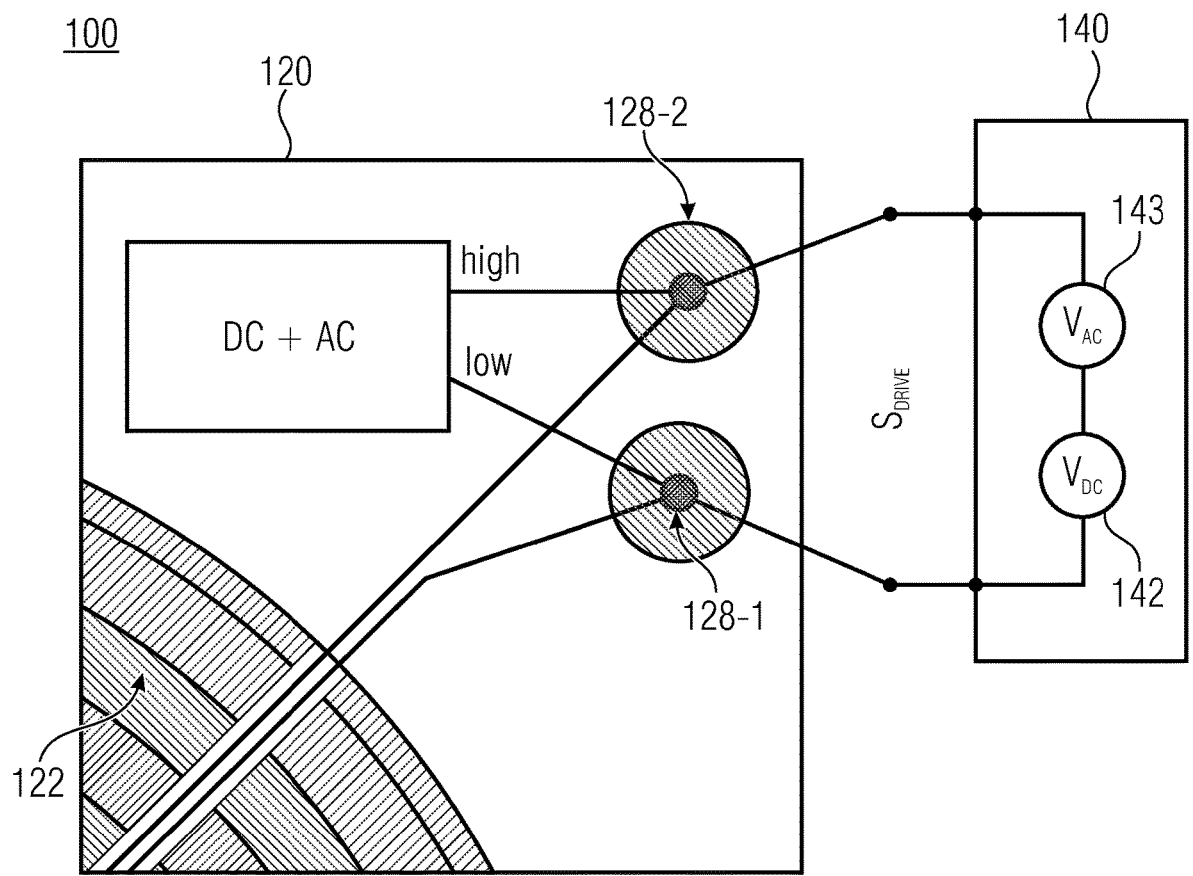
FIGS. 3a-3c show different exemplary measured resonance shifts depending on the applied bias signal in an actor operation of the piezoelectric transducer according to an embodiment.
Figure 3B:
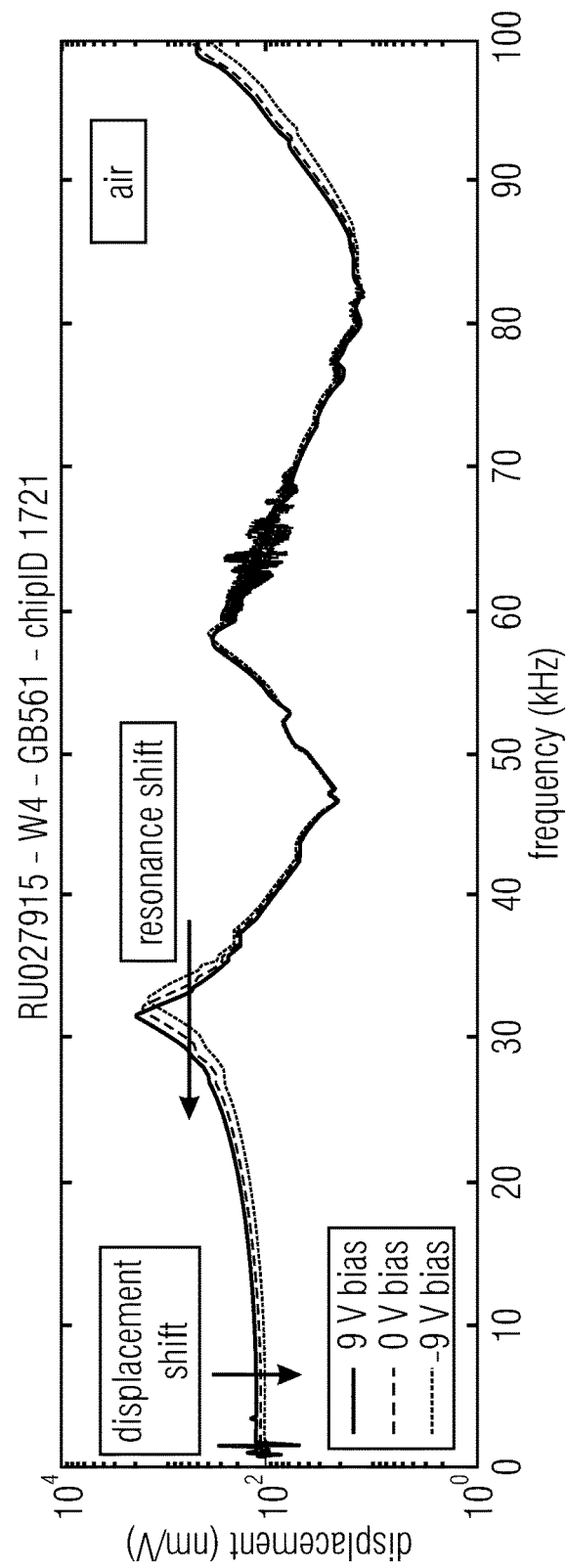
Figure 3C:
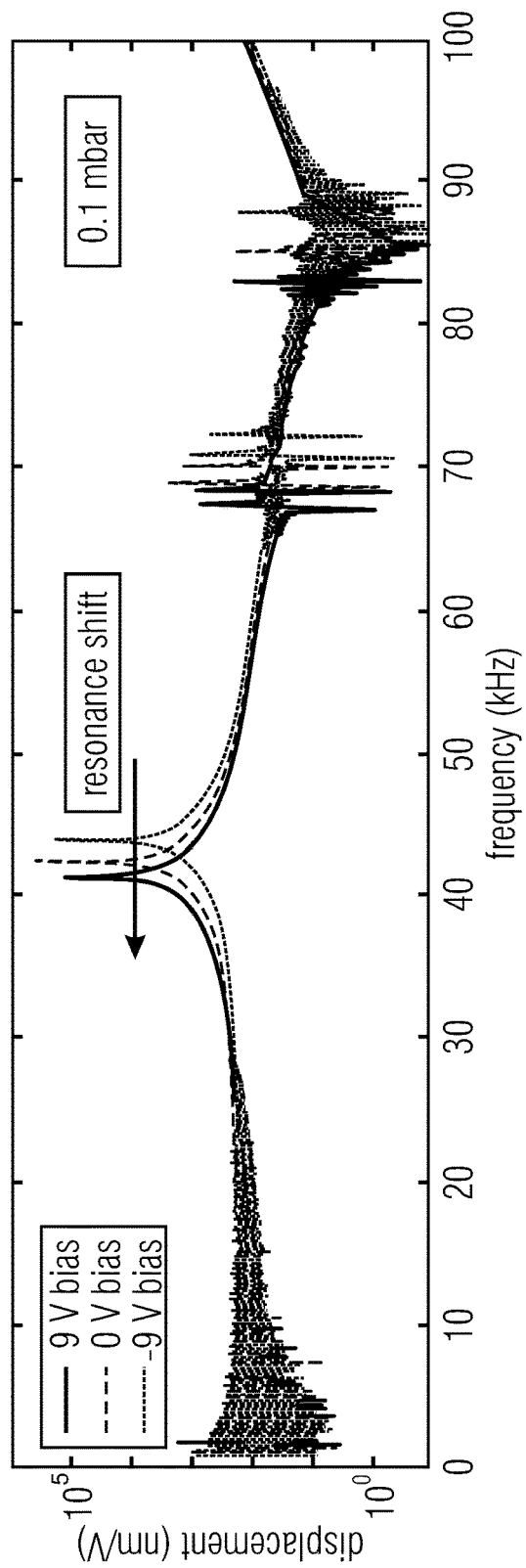

FIGS. 3a-3c show different exemplary measured resonance shifts depending on the applied bias signal $S_{BIAS}$ in an actor operation of the piezoelectric transducer 120 according to an embodiment 120.

According to a further embodiment, the piezoelectric transducer 120 may be implemented as an actuator, e.g. in form of a piezoelectric speaker that uses the piezoelectric effect for generating sound, e.g. in the acoustic or ultrasonic frequency range. The bias signal $S_{BIAS}$, e.g. a bias voltage $V_{DC}$, to the piezoelectric trimming region TR of the piezoelectric transducer 120 is provided for adjusting a second frequency behavior (target behavior) of the piezoelectric transducer 120. The initial mechanical motion is created by applying with an AC signal source 143 an alternating signal (voltage) $V_{AC}$ to a piezoelectric transducing element 126, and this motion is typically converted into sound, e.g. audible sound or ultra-sonic sound, using the diaphragm (membrane) 122. When the diaphragm is excited with an alternating voltage, this causes motion of the diaphragm which gives the sound. The drive signal $S_{DRIVE}$ (=$V_{DC}$+ $V_{AC}$) between the contact regions 128-1, 128-2 of the piezoelectric transducer 120 comprises a DC and an AC signal component, for example.

FIG. 3b shows the resonance shift results performed with LDV (LDV=laser Doppler velocity) in a normal air environment, wherein FIG. 3c shows the resonance shift results performed with the LDV in a vacuum environment for the piezoelectric MEMS transducer 120.

In FIGS. 3b-3c, the sample chip having the MEMS transducer 120 is actuated with a DC bias voltage and an AC voltage whose frequency is swept from 1 kHz to 100 kHz. Here, the actuation occurs between the readout electrodes 128-1, 128-2. Therefore, the sample is operated as an actor (micro-speaker), which emits acoustic waves at different frequencies.

A maximal pressure is achieved at the first resonance frequency, hence at the peak of the frequency response. The peak position changes with the applied bias voltage $S_{BIAS}$. Thus, the piezoelectric MEMS transducer 120 of the MEMS device 100 can be optimally operated at different working frequencies (operating frequencies) by changing the applied bias voltage.

This trimming principle can also be used in ultrasonic applications with tunable working frequencies, e.g. for highly miniaturized distance measurement systems.

According to the approach as shown in FIG. 3a-3c, the piezoelectric MEMS device 100 may be implemented as a piezoelectric MEMS actor based on the piezoelectric effect, wherein the MEMS device 100 uses a AC voltage $V_{AC}$ for operating and driving the piezoelectric MEMS transducer 120 and, also, uses a bias voltage $S_{BIAS}$ ($V_{DC}$) which is applied between the driving electrodes 128-1, 128-2 of the piezoelectric MEMS transducer 120 for adjusting the target behavior of the frequency response of the piezoelectric transducer 120. The DC voltage $S_{BIAS}$ applied to the MEMS transducer 120 causes a mechanical reaction in the MEMS transducer 120 (due to the direct piezoelectric effect). When applied to the piezoelectric trimming region of the piezoelectric transducer 120, the generated strain/stress leads to a deformation or deflection of the MEMS structure 122, e.g. the membrane structure 120. Such a deformation can be used to trim the sensitivity, e.g. by counteracting the impact of material pre-stress hence making the whole structure softer/harder, and/or to trim the frequency response (e.g., LFRO and/or resonance) of the membrane structure 122. LFRO can be adjusted if the device deformation under bias leads to a physical change of the acoustic properties of the system, e.g. a variation of the size of ventilation holes (see also, for example, FIGS. 6a-6c and the associated text passages of the description).

Also, the same principle can be used to correct for manufacturing variations of the MEMS product in order to meet a defined target specification.

According to the approach as shown in FIGS. 3a-3c, the actuation voltage $S_{DRIVE}$ can be applied between each set of electrodes (readout, control, both) of the piezoelectric MEMS transducer 120.

In the following, the principle structure (setup) and functionality of a MEMS device 100 according to a further embodiment are described based on FIGS. 4a-4d.

According to the embodiment of FIGS. 4a-4d, the MEMS device 100 comprises a piezoelectric transducer 120 (actuator or sensor) having a first frequency behavior, wherein the piezoelectric transducer 120 comprises a piezoelectric trimming region TR, and a control circuitry 140 configured to provide a bias signal $S_{BIAS}$ with respect to a first reference potential, e.g. ground $GND_1$, to the piezoelectric trimming region 126 of the piezoelectric transducer 120 for adjusting a second frequency behavior (target behavior) of the piezoelectric transducer 120.

According to an embodiment, the piezoelectric transducer 120 comprises a (first) piezoelectric transducing element (piezoelectric layer) 126 and a further (second) piezoelectric transducing element TR, wherein the further (second) piezoelectric transducing 127 element forms the piezoelectric trimming region TR. The piezoelectric transducer 120 has a membrane structure 122, wherein the piezoelectric transducing element 126 and the further piezoelectric transducing element 127 are fixed to or form the membrane structure 122. Thus, the membrane structure 122 may comprise (may be made) at least partially or completely (of) piezoelectric material.

According to an embodiment, the membrane structure 122 may comprise a diaphragm (e.g., having a metallic, plastic, insulating or semiconductor material, e.g. poly-Si, etc.), wherein the piezoelectric transducing element 126 and the further piezoelectric transducing element 127 may be fixed (e.g., mechanically coupled or attached) to the diaphragm. According to a further embodiment, the piezoelectric transducing element 126 and the further piezoelectric transducing element 127 may form the membrane structure 122, wherein the membrane structure 122 may consist of or may comprise the piezoelectric material of the piezoelectric transducing element 126 and of the further piezoelectric transducing element 127.

The (first) piezoelectric transducing element 126 and the further (second) piezoelectric transducing element 127 may be formed as separate piezoelectric transducing elements 126, 127. The term "separate" piezoelectric transducing elements 126, 127 relates to the embodiments which describe the further (second) piezoelectric transducing element 127, such as an "additional" trimming electrode, e.g. as an external trimming ring or an internal trimming electrode. The additional piezoelectric transducing element (=trimming electrode) 127 comprises its own terminals 130, 132 which are electrically separated from the terminals 130, 132 of the first piezoelectric transducing element 126. Thus, the first piezoelectric transducing element 126 and the second piezoelectric transducing element 127 can be separately (=independently) operated, e.g. driven (=signal supplied) and/or read-out (=signal sensed). Thus, the (first) piezoelectric transducing element 126 and the further (second) piezoelectric transducing element 127 may be formed as electrically and/or spatially separated (=independent) piezoelectric transducing elements 126, 127.

Figure 4A:
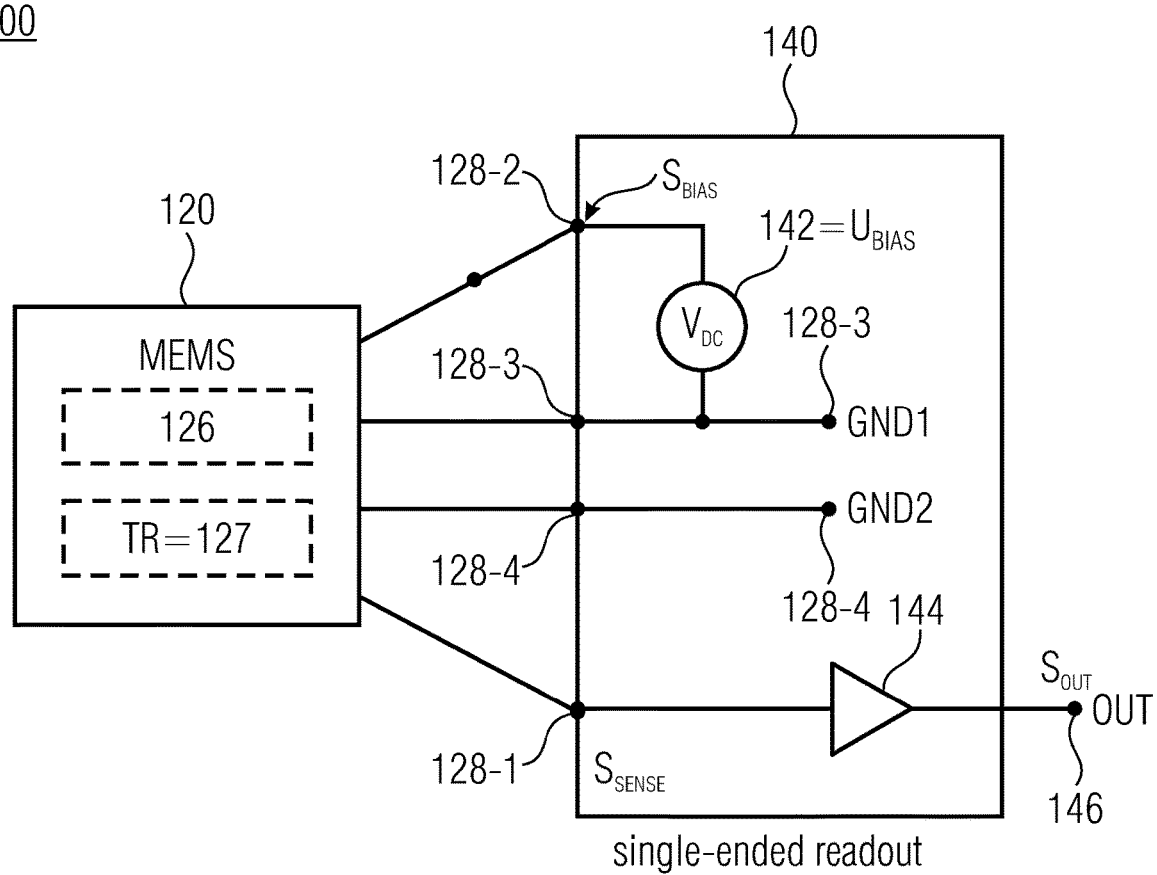
FIGS. 4a-4d show an exemplary schematic illustration of a MEMS device according to a further embodiment.
Figure 4B:
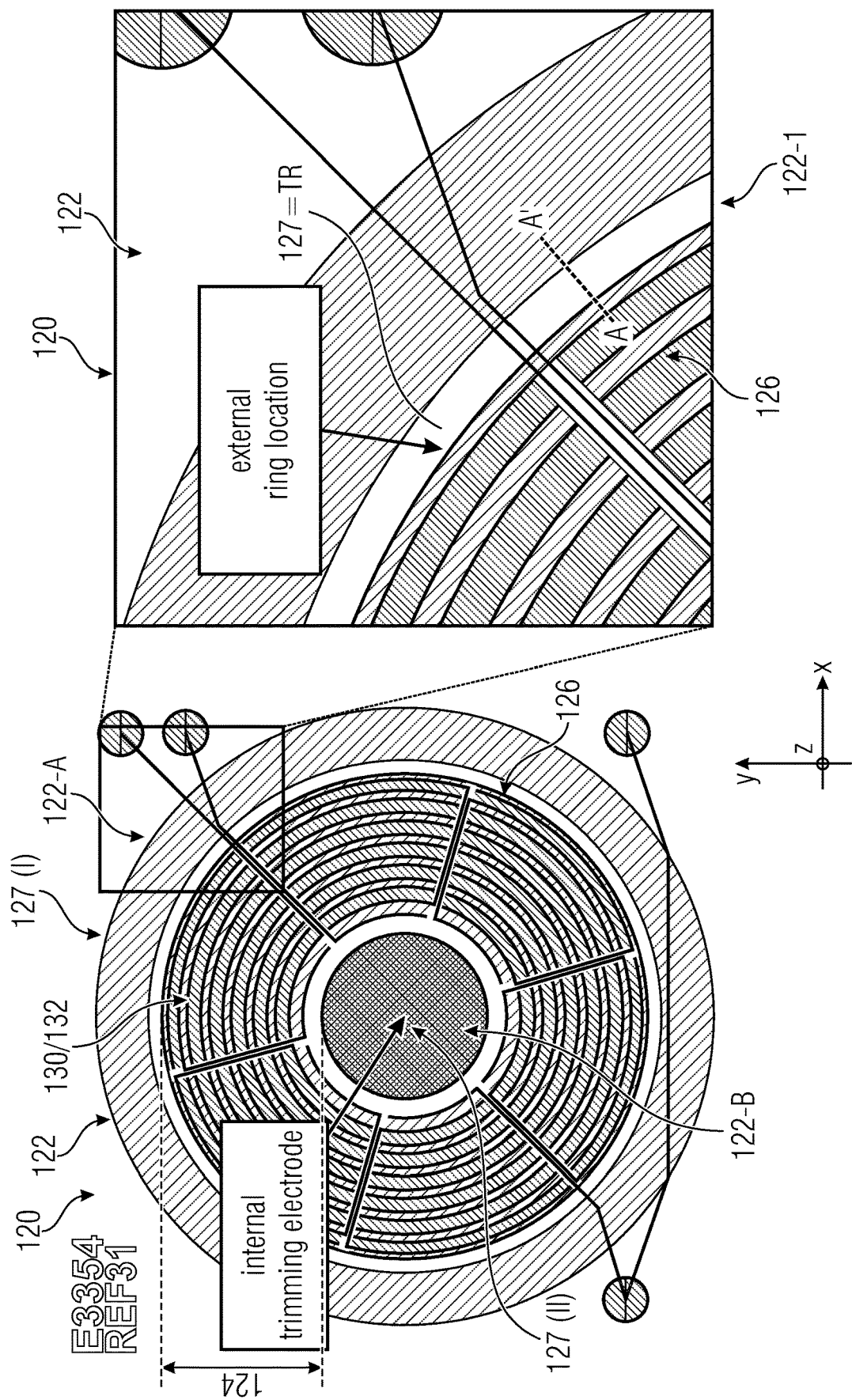
Figure 4C:
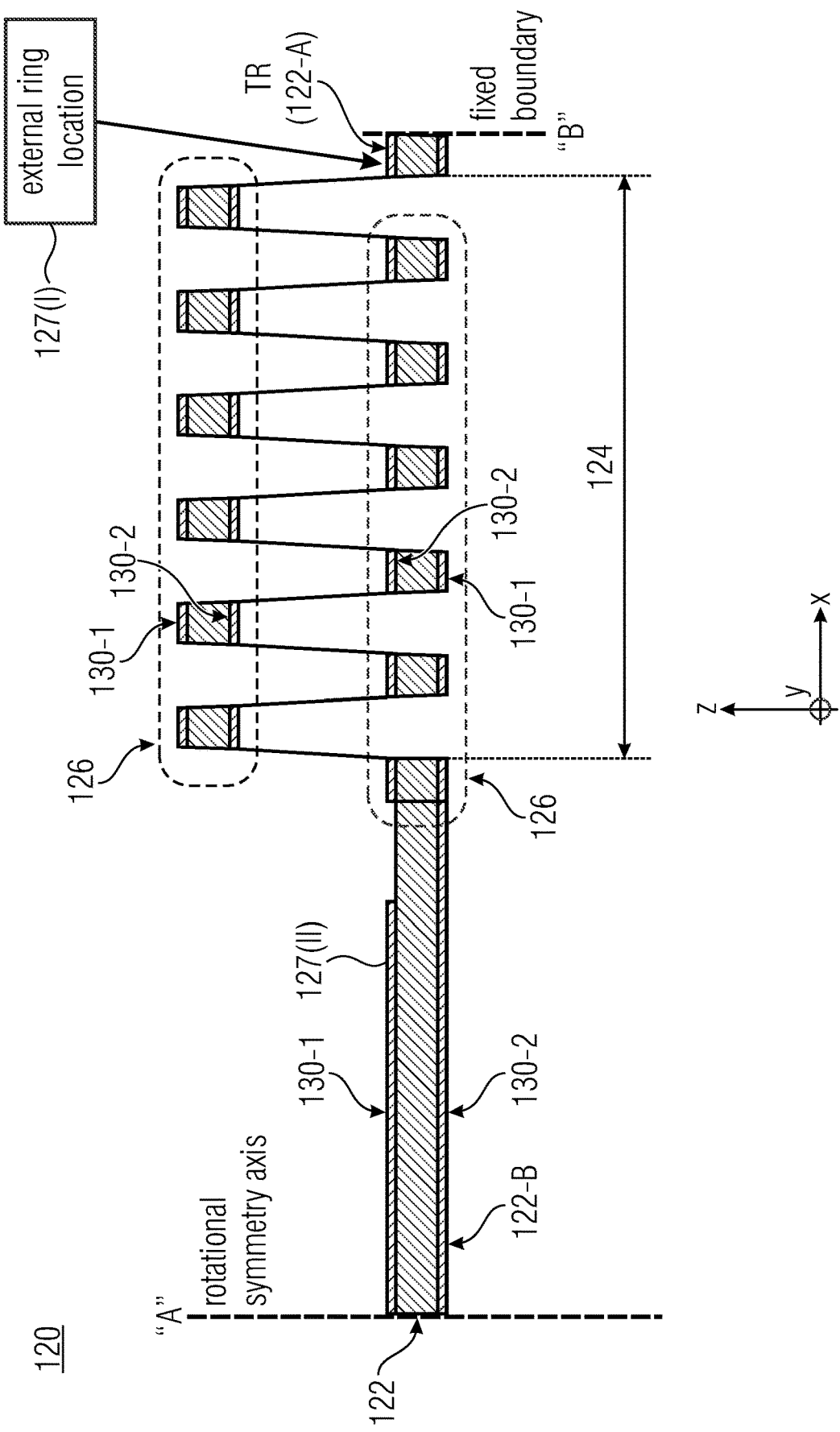
Figure 4D:
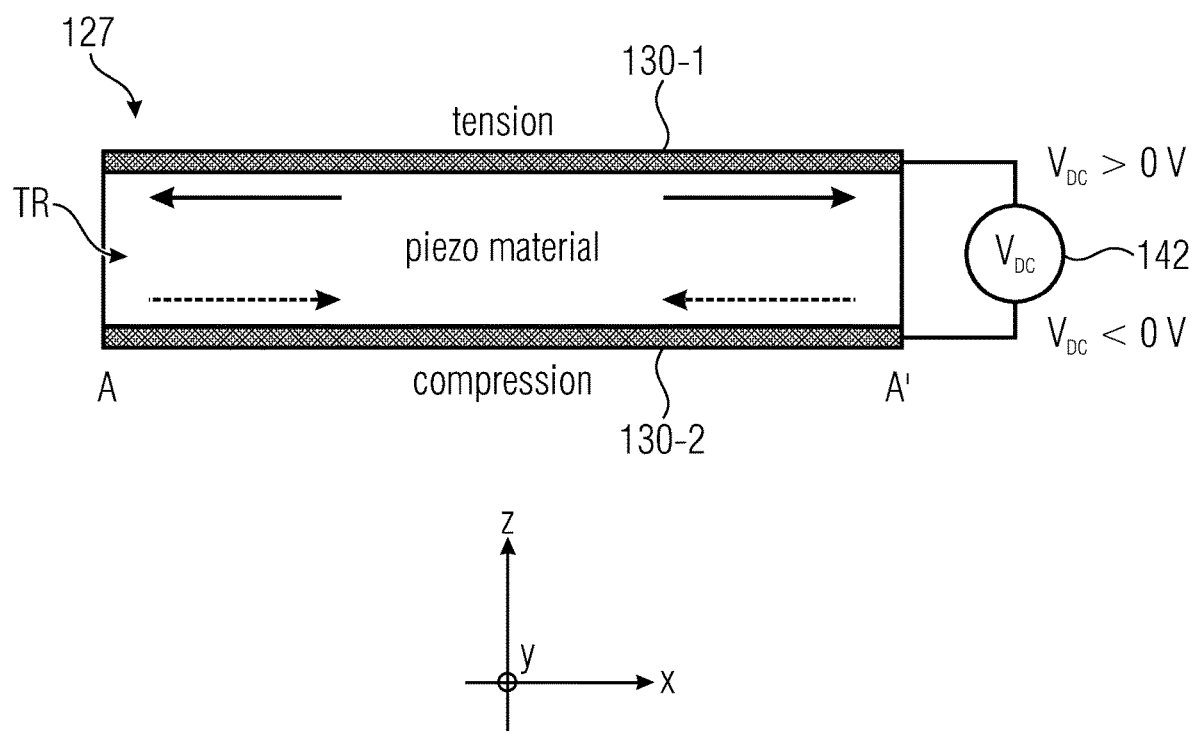

According to the exemplary schematic illustration of the MEMS device 100 of FIGS. 4a-4d, the MEMS device 100 comprises the piezoelectric transducer 120 (e.g., a two terminal piezoelectric device with a control electrode) and a control circuitry 140 (with a biasing and readout function). FIG. 4a shows a schematic equivalent circuit of the MEMS device 100 having the piezoelectric MEMS transducer 120 and the control circuitry 14o, wherein FIG. 4b shows an exemplary technical implementation of the piezoelectric MEMS transducer 120, and wherein FIG. 4c shows an enlarged cross-sectional partial view of the piezoelectric MEMS transducer 120. FIG. 4d shows an enlarged cross-ssectional partial view of the trimming region TR of the piezoelectric MEMS transducer 120 along the section line A-A' in FIG. 4b.

As shown in FIGS. 4a-4c, the piezoelectric MEMS transducer 120 may have a membrane structure 122, a first piezoelectric (layer) structure 126 (=first transducing element), a second piezoelectric (layer) structure 127 (=second transducing element 127 (I) at a border region 122-A and/or 127 (II) at a center region 122-B of the membrane structure 122) and contact structures (contact layers) 130, 132 which are connected to contact regions 128-1, 128-2, 128-3, 128-4. The terminal 128-2 forms a control electrode for the second piezoelectric (layer) structure 127 to provide a bias signal $S_{BIAS}$ with respect to a first reference potential, e.g. ground $GND_1$, at the third terminal 128-3.

The membrane structure 122 may comprise, for example, a corrugated membrane region 124, wherein the first piezoelectric (layer) structure 126 and the contact structures (contact layers) 130, 132 are fixed (=mechanically coupled or attached) to or form the membrane structure 122, e.g. to a corrugated membrane region 124 of the membrane structure 122. The contact regions 128-1, 128-2, 128-3, 128-4 provide for electrical contacts and connections of the first and second piezoelectric structures 126, 127 to the control circuitry 140 of the MEMS device 100.

According to an embodiment, the voltage source $V_{DC}$ 142 is connected between the second and third terminal 128-2, 128-3 of the piezoelectric transducer 120, i.e. the control bias $S_{BIAS}$ is applied between the control electrodes 128-2, 128-3, to provide the bias signal $S_{BIAS}$ with respect to a first reference potential, e.g. ground $GND_1$, at the third terminal 128-3. The first terminal 128-1 forms the sense terminal for outputting the sense signal $S_{SENSE}$ with respect to a second reference potential, e.g. ground $GND_2$, at the fourth terminal 128-4.

According to an embodiment, the terminals 128-3, 128-4 (ground terminals) may be formed as separate ground terminals 128-3, 128-4. Thus, a separated ground connection (e.g., with different reference potentials $GND_1$ and $GND_2$) can be provided for the control electronics and the sense electronics.

According to a further embodiment, the terminals 128-3, 128-4 (ground terminals) may be connected to the same reference potential ($GND_1=GND_2$) or the terminals 128-3, 128-4 (ground terminals) may be formed as a common (reference) terminal. Thus, a common ground connection (with $GND_1=GND_2$) can be provided for the control electronics and the sense electronics.

The second piezoelectric (layer) structure 127 is mechanically coupled (attached) to a further region or further regions of the membrane structure 122, e.g. to a border region 122-A and/or to a center region 122-B of the membrane structure 122.

As exemplarily shown in FIG. 4b, the second piezoelectric (layer) structure 127 may also comprise a plurality of partial structures 127 (I), 127 (II), which are arranged at different regions 122-A (border region), 122-B (center region) of the membrane structure 122 for trimming and/or adjusting of the frequency behavior of the piezoelectric MEMS transducer 120. In case of a plurality of partial structures 127, a control electrode (terminal 128-3) may be provided for each piezoelectric partial structure 127.

Alternatively, the second piezoelectric (layer) structure 127 may also comprise only one piezoelectric structure 127, which is arranged at the membrane structure 122 for trimming and/or adjusting of the frequency behavior of the piezoelectric MEMS transducer 120.

As exemplarily shown in FIGS. 4b-4c, the second piezoelectric (layer) structure 127 may comprise an external trimming ring as the trimming region TR. The external trimming ring may be introduced as a ring electrode 127 at the outer rim 122-A of the membrane 122 to tune the resonance behavior, e.g. the resonance frequency, hence the sensitivity, by trimming the membrane compliance. Such a tuning principle recalls the tuning of a drum.

Alternatively, or additionally, a similar effect could be achieved using an internal trimming electrode TR at the center region 122-B of the membrane 122, wherein the internal trimming electrode TR at the center region 122-B introduces strain/stress in the center part of the device 122.

The bias signal application on the control electrode 128-2 can be performed using a specific ASIC output. The MEMS signal read-out and bias control can run on different channels, i.e. may be separated and independent.

As exemplarily shown in FIG. 4b, the piezoelectric MEMS transducer 120 may be segmented, i.e. may comprise a segmented membrane structure 122 and a segmented piezoelectric (layer) structure 126, wherein the (e.g., four or six) segments of the piezoelectric MEMS transducer 120 are serially connected. According to a further embodiment, the piezoelectric MEMS transducer 120 may comprise a continuous (not-segmented or one-piece) structure. The second piezoelectric (layer) structure(s) 127 may (each) comprise a continuous (not-segmented or one-piece) structure.

According to an embodiment, the piezoelectric transducer 120 may be implemented as a piezoelectric sensor for conducting a sensor operation. The piezoelectric sensor uses the piezoelectric effect to measure changes in pressure, acceleration, temperature, strain, or force by converting them to an electrical charge. The piezoelectric transducer 120 has (usually) a (very) high DC output impedance and can be modeled as a proportional voltage source. The output voltage $S_{SENSE}$ of the piezoelectric sensor 120 is directly proportional to the applied force, pressure, or strain, i.e. to the force, pressure, or strain applied to the displaceable or deflectable membrane structure 122 of the piezoelectric transducer 120.

According to a further embodiment, the piezoelectric transducer 120 may be also implemented as an actuator, e.g. in form of a piezoelectric speaker (loudspeaker or piezo bender due to its mode of operation) that uses the piezoelectric effect for generating sound. The initial mechanical motion is created by applying a voltage to a piezoelectric material, and this motion is typically converted into audible sound using a diaphragm (membrane). When the diaphragm is excited with an alternating voltage this causes dishing of the diaphragm which gives the sound.

FIG. 4c shows an enlarged cross-sectional partial view of the piezoelectric MEMS transducer 120 along the radius of the membrane structure 122 from its center "A" (=rotational symmetry axis) to the fixed boundary "B".

Moreover, the above evaluations in connection with FIG. 1c are equally applicable to the piezoelectric structures 126, 127 of FIGS. 4a-4d.

The control circuitry 140 is connected to the first, second and third terminal 128-1, 128-2, 128-3 of the piezoelectric transducer 120, wherein the first terminal 128-1 forms a sense terminal, the second terminal 128-2 forms a bias terminal, and the third terminal 128-3 forms a reference terminal (which is connected to a reference potential GND, e.g. ground potential) of the piezoelectric transducer 120. The control circuitry 140 comprises a voltage source 142 for providing the bias signal (bias voltage) $S_{BIAS}$ (=$V_{DC}$) to the second terminal 128-2 of the piezoelectric transducer 120, wherein the second terminal 128-2 is connected to the piezoelectric trimming region(s) TR of the piezoelectric transducer 120. The voltage source $V_{DC}$ 142 is connected between the second and third terminal 128-2, 128-3 of the piezoelectric transducer 120. Thus, the control circuitry 140 is configured to adjust the second frequency behavior (=target behavior) of the piezoelectric transducer 120 by providing the bias signal $S_{BIAS}$, e.g. a DC bias voltage $V_{DC}$, to the piezoelectric trimming region TR of the piezoelectric transducer 120.

Further, the first terminal (output terminal) 128-1 of the piezoelectric transducer 120 is connected to a signal buffer 144 of the control circuitry 140 for providing the output signal Sour of the MEMS device 100 (e.g., in a single-ended readout configuration) to the output terminal 146. The signal level of the output signal Sour at the output terminal 146 may be related to a reference potential GND, e.g. ground potential.

According to the present approach, the piezoelectric MEMS device 100 may be implemented as a piezoelectric MEMS sensor based on inverse piezoelectric effect, wherein the MEMS device 100 uses a bias voltage $S_{BIAS}$ which is applied between the electrodes 128-2, 128-3 of the piezoelectric MEMS transducer 120. The DC voltage applied to the MEMS transducer 120 causes a mechanical reaction in the piezoelectric trimming region TR of the MEMS transducer 120 (due to the direct piezoelectric effect), wherein the generated strain/stress leads to a deformation or deflection of the MEMS structure 122, e.g. the membrane structure 122. Such a deformation can be used to trim the sensitivity, e.g. by counteracting the impact of material pre-stress hence making the whole structure softer/harder, and/or to trim the frequency response (LFRO and resonance). LFRO can be adjusted if the device deformation under bias leads to a physical change of the acoustic properties of the system, e.g. a variation of the size of the ventilation hole (see also for example FIGS. 8a-8c and the associated text passages of the description). Also, the same principle can be exploited to correct for manufacturing variations of a MEMS product in order to meet a defined target specification.

Thus, exemplary embodiments of the present disclosure provide different trimming approaches suitable for piezoelectric MEMS devices during the frequency response of the piezoelectric MEMS device, such as the sensitivity, the LFRO and/or the resonance frequency (resonance behavior) of the MEMS device having a piezoelectric transducer can be individually trimmed, e.g. during a final product test or even during the (ongoing) operation of the piezoelectric MEMS device. Thus, according to the described embodiment, piezoelectric MEMS devices can be individually trimmed to meet a tight target specification.

According to a further embodiment, the piezoelectric transducer 120 may be implemented as an actuator, e.g. in form of a piezoelectric speaker that uses the piezoelectric effect for generating sound, e.g. in the acoustic or ultrasonic frequency range.

FIG. 4d shows an enlarged cross-sectional partial view of the trimming region TR of the piezoelectric structure 127 of the piezoelectric MEMS transducer 120 along the section line A-A' in FIG. 4b and exemplary biasing conditions (tension and compression) of the trimming region TR according to the embodiment. Depending on the polarity of the (DC) bias voltage $S_{BIAS}$, different strain conditions (tension or compression) are exerted on the piezoelectric material of the piezoelectric trimming region TR of the piezoelectric structure 127 which results in different biasing conditions of the piezoelectric trimming region TR of the piezoelectric structure 127 of the MEMS device 100. Moreover, based on the strength (signal value) of the (DC) bias voltage $S_{BIAS}$, the magnitude and extent of the strain conditions in the piezoelectric material of the piezoelectric trimming region TR of the piezoelectric structure 127 can be adjusted.

FIG. 4d shows an exemplary implementation of contact structures (contact layers) 130-1, 130-2 for the piezoelectric material of the piezoelectric trimming region TR of the piezoelectric structure 127. As shown in FIG. 4d, the contact structures 130-1, 130-2 may be arranged on different, opposing surfaces (front and back side) of the piezoelectric layer (=piezoelectric trimming region) TR, i.e. the piezoelectric layer TR is sandwiched between the contact structures 130-1, 130-2.

Figure 5B:
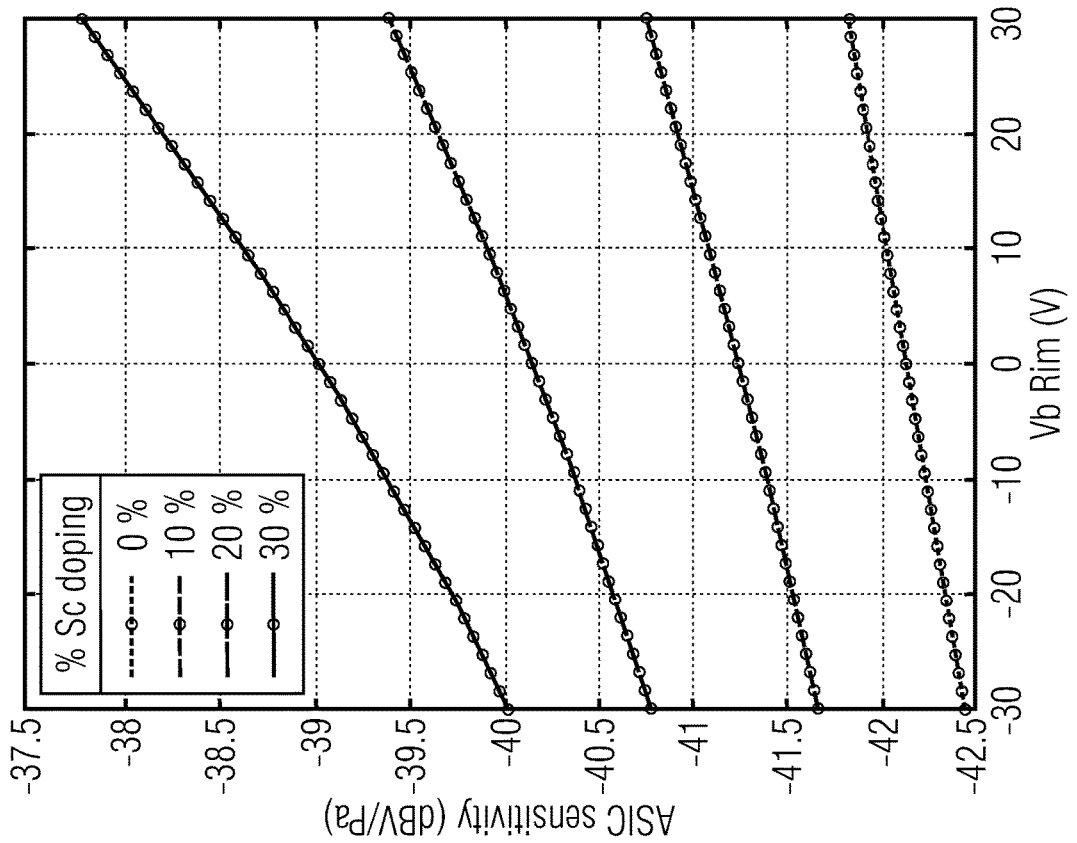
FIGS. 5a-5b simulations of the resulting adjusting range (trimming range) of the frequency behavior of the piezoelectric transducer.
Figure 5A:
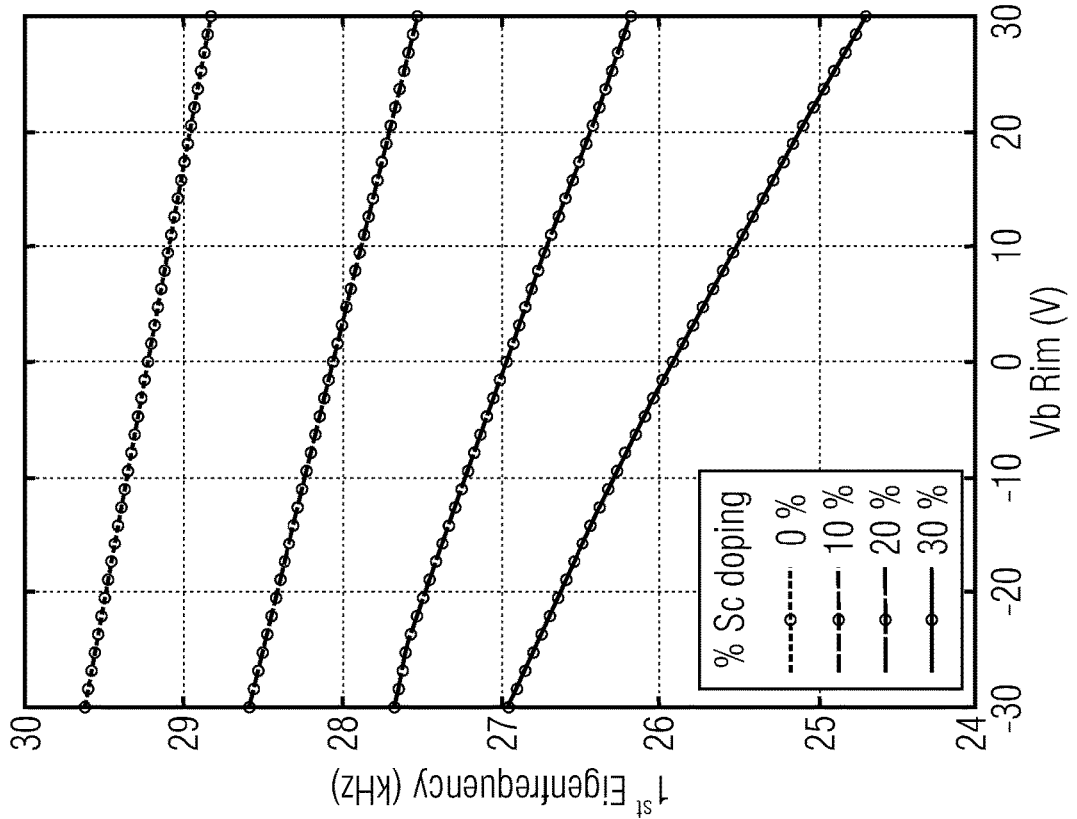

FIGS. 5a-5b show exemplary simulations of the resulting adjusting range (trimming range) of the frequency behavior of the piezoelectric transducer 120. FIG. 5a shows the dependency of the 1st Eigenfrequency from the mechanical stress (Vb Rim) based on different Sc doping concentrations. FIG. 5b shows the dependency of the ASIC sensitivity from the mechanical stress (Vb Rim) based on different Sc doping concentrations.

The simulation results were performed for a reference design of piezoelectric transducer 120. As shown in FIGS. 5a-5b, the sensitivity tuning effect depends on the pre-stress of the structure 120 and on the piezoelectric properties of the active material 126, 127. As shown in FIGS. 5a-5b, the simulation were exemplary performed with no pre-stress and different Sc doping concentrations (Sc=scandium) of a ScAlN (Scandium Aluminum Nitride) based device. The tuning effect increases with an increasing Sc concentration.

In the following, further embodiments of the MEMS device 100, 100 are described, where-in the following valuations are equally applicable to the MEMS device 100 according to FIGS. 1a-1c, 2 and 3a-3b, 4a-4d and 5a-5b.

According to an embodiment, the (first) piezoelectric transducing element 126 and the further (second) piezoelectric transducing element 127 form the piezoelectric trimming region TR. Thus, embodiments of the MEMS device 100 may be combined in that at least a part of the (first) piezoelectric transducing element 126 and at least a part of the further (second) piezoelectric transducing element 127, which is electrically separated from the (first) piezoelectric transducing element 126, form together the piezoelectric trimming region.

According to an embodiment, the control circuitry 140 may configured to provide the bias signal $S_{BIAS}$ (with a defined signal strength) to the piezoelectric trimming region TR for adjusting the second frequency behavior by introducing mechanical stress or strain in the piezoelectric trimming region TR of the piezoelectric transducer 120.

According to an embodiment, the first frequency behavior is a first frequency response of the piezoelectric transducer 120 and the second frequency behavior is a second frequency response of the piezoelectric transducer 120, wherein the (first and second) frequency response of the piezoelectric transducer 120 comprises the sensitivity, the LFRO (low-frequency roll-off) and/or a resonance (frequency) of the piezoelectric transducer 120.

According to an embodiment, the first and second frequency response of the piezoelectric transducer 120 comprises at least one of the sensitivity, the LFRO (low-frequency roll-off), a resonance (frequency), a total harmonic distortion (THD) and the acoustic overload point (AOP) of the piezoelectric transducer 120.

According to an embodiment, the control circuitry 140 is configured to provide the bias signal $S_{BIAS}$ to a readout contact (pin) 128-2 of the piezoelectric transducer 120.

According to an embodiment, the piezoelectric transducer 120 may comprise a (first) pair of contacts (single ended read-out) 128-1 128-2, wherein the control circuitry 140 is configured to provide the (first) bias signal $S_{BIAS}$ between the (first) pair of contacts 128-1 128-2.

According to an embodiment, the piezoelectric transducer 120 may comprise a further (second) pair of contacts (differential read-out) 128-3, 128-4, wherein the control circuitry 140 is configured to provide further (second) bias signal $S_{BIAS'}$ between the further (second) pair of contacts 128-3, 128-4.

According to an embodiment, the control circuitry is configured to provide the bias signal as a DC signal (DC voltage) to the piezoelectric electric trimming region of the piezoelectric transducer (during the operation of the piezoelectric transducer).

According to an embodiment, the control circuitry 140 is configured to set the DC signal $S_{BIAS}$ for meeting a calibration target of the piezoelectric transducer 120.

According to an embodiment, the control circuitry 140 is configured to provide the bias signal $S_{BIAS}$ as a constant DC signal $V_{DC}$ during the operation of the piezoelectric transducer.

According to an embodiment, the control circuitry 140 is configured to adapt the bias signal $S_{BIAS}$ during the operation of the piezoelectric transducer 120 based on an environmental parameter for adapting the second frequency behavior of the piezoelectric transducer in response to the environmental parameter (environmental condition).

According to an embodiment, the MEMS device 100 (system) can be the sensing subpart (component) of a smartphone, head phone or headset or other portable device.

Figure 6C:
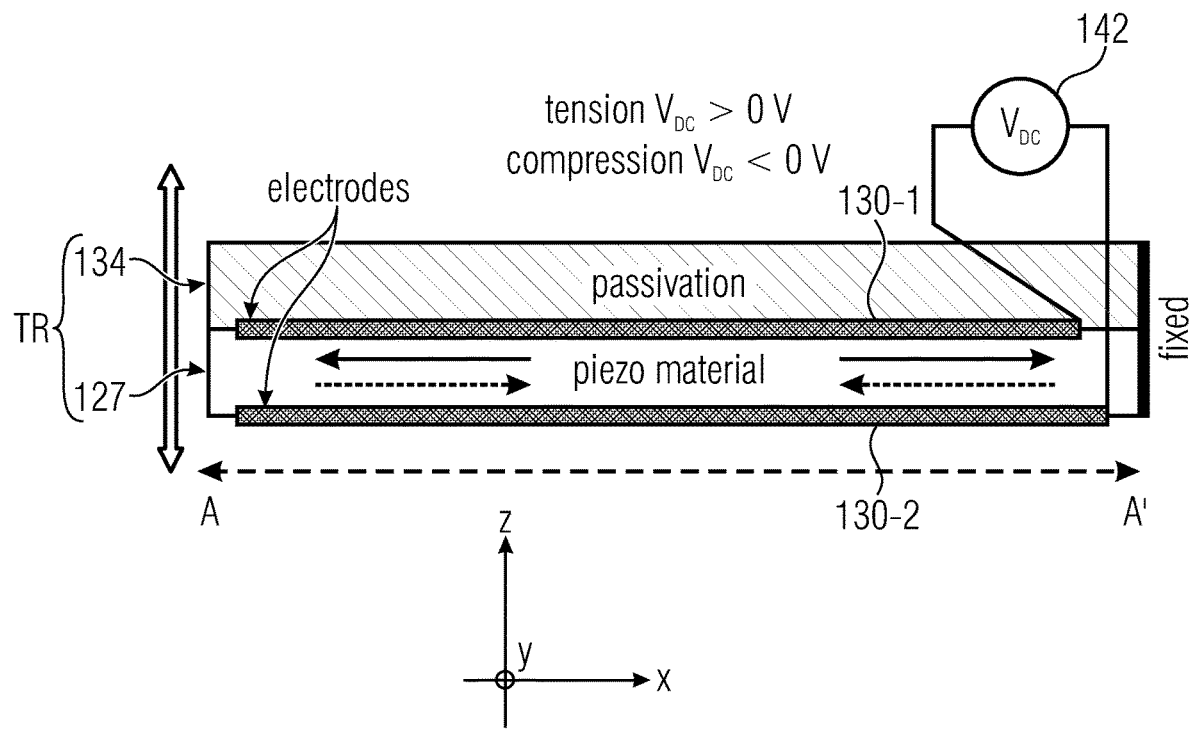

FIGS. 6a-6c show an exemplary schematic illustration of a MEMS device 100 according to a further embodiment. FIG. 6a shows a schematic top view (plain view) of the piezoelectric MEMS sound transducer 120 of the MEMS device 100. FIG. 6b shows an enlarged partial view of the piezoelectric MEMS sound transducer 120 of the MEMS device 100. FIG. 6c shows an enlarged cross-sectional partial view of the trimming region TR of the piezoelectric MEMS transducer 120 along the section line A-A' in FIG. 6b.

Moreover, the above evaluations in connection to the MEMS device 100 according to FIGS. 1a-1c, 2 and 3a-3b, 4a-4d and 5a-5b are equally applicable to the MEMS device 100 according to FIGS. 6a-6c.

As shown in FIGS. 6a-6c, the piezoelectric MEMS transducer 120 has a membrane structure 122, a first piezoelectric (layer) structure 126 (=first transducing element), a second piezoelectric (layer) structure 127. The membrane structure 122 may comprise, for example, a corrugated membrane region 124, wherein the first piezoelectric (layer) structure 126 is mechanically coupled (attached) to the membrane structure 122, e.g. to a corrugated membrane region 124 of the membrane structure 122. Contact regions 128-1, 128-2, 128-3 provide for electrical contacts and connections of the first and second piezoelectric structures 126, 127 to the control circuitry 140 of the MEMS device 100.

The piezoelectric trimming region TR which is associated to the further piezoelectric transducing element 127 comprises a flap element 134 (=wing or fin element) in the membrane structure 122, e.g. as an integral portion of the membrane structure 122. The flap element 134 can be deflected by means of the bias signal VBIAS between a first position (e.g., closed condition) and a second position (e.g., open condition=additional ventilation path through the membrane).

Moreover, based on the strength (signal value) of the (DC) bias voltage $S_{BIAS}$, the magnitude and extent of the strain conditions in the piezoelectric material 127 of the piezoelectric trimming region TR of the piezoelectric transducer 126 can be adjusted. Thus, the flap element 134 can be (continuously) deflected by means of the bias signal VBIAS into intermediate positions between a first position (e.g., closed condition) and a second position (e.g., completely open condition) for providing an additional ventilation path with an adjusted path diameter through the membrane 122.

FIG. 6c shows an enlarged cross-sectional partial view of the trimming region TR of the piezoelectric structure 127 of the piezoelectric MEMS transducer 120 along the section line A-A' in FIG. 6b and exemplary biasing conditions (tension and compression) of the trimming region TR according to the embodiment. Depending on the polarity of the (DC) bias voltage $S_{BIAS}$, different strain conditions (tension or compression) are exerted on the piezoelectric material of the piezoelectric trimming region TR of the piezoelectric structure 127 which results in different biasing conditions of the piezoelectric trimming region TR of the piezoelectric structure 127 of the MEMS device 100. Moreover, based on the strength (signal value) of the (DC) bias voltage $S_{BIAS}$, the magnitude and extent of the strain conditions in the piezoelectric material of the piezoelectric trimming region TR of the piezoelectric structure 127 can be adjusted. Thus, depending on the strength and polarity of the applied bias voltage $S_{BIAS}$ both upwards and downwards flap movement can be achieved.

According to embodiments, the described trimming and/or adjusting of the frequency behavior of the piezoelectric MEMS transducer 120 can be used for the initial microphone trimming but also during operation. Alternatively, or additionally, the frequency response of the piezoelectric MEMS device, (sensitivity, LFRO and/or resonance behavior) can be adjusted depending on environmental conditions of the MEMS device 100. In case, the MEMS device is in a very loud or quiet environment, the trimming of the piezoelectric MEMS transducer 120 can be conducted to adapt the frequency response to the respective environmental conditions.

In case, the MEMS device 100 comprises flaps 134 in the membrane structure 122, that can be opened and closed for trimming, it is possible to adapt the low frequency roll-off to the situation, e.g. the environmental condition. This can be useful, for example, in a windy environment, so that the low frequencies that come from the wind are more strongly suppressed and thus prevent the membrane structure 122 from being deflected too much.

According to an embodiment, the piezoelectric transducer 120 may be implemented as a piezoelectric sensor. The piezoelectric sensor uses the piezoelectric effect to measure changes in pressure, acceleration, temperature, strain, or force by converting them to an electrical charge. The piezoelectric transducer 120 has (usually) a (very) high DC output impedance and can be modeled as a proportional voltage source. The output voltage $S_{SENSE}$ of the piezoelectric sensor 120 is directly proportional to the applied force, pressure, or strain, i.e. to the force, pressure, or strain applied to the displaceable or deflectable membrane structure 122 of the piezoelectric transducer 120.

According to a further embodiment, the piezoelectric transducer 120 may be also implemented as an actuator, e.g. in form of a piezoelectric speaker (loudspeaker or piezo bender due to its mode of operation) that uses the piezoelectric effect for generating sound. The initial mechanical motion is created by applying a voltage to a piezoelectric material, and this motion is typically converted into audible sound using a diaphragm (membrane). When the diaphragm is excited with an alternating voltage this causes dishing of the diaphragm which gives the sound.

Thus, exemplary embodiments of the present disclosure provide different trimming approaches suitable for piezoelectric MEMS devices during the frequency response of the piezoelectric MEMS device, such as the sensitivity, the LFRO, the resonance frequency (resonance behavior) and/or the total harmonic distortion (THD) and/or the acoustic overload point (AOP) of the MEMS device having a piezoelectric transducer can be individually trimmed, e.g. during a final product test or even during the (ongoing) operation of the piezoelectric MEMS device. Thus, according to the described embodiment, piezoelectric MEMS devices can be individually trimmed to meet a tight target specification. Also, the same principle can be exploited to correct for manufacturing variations of a MEMS product in order to meet a defined target specification.

Figure 7A:
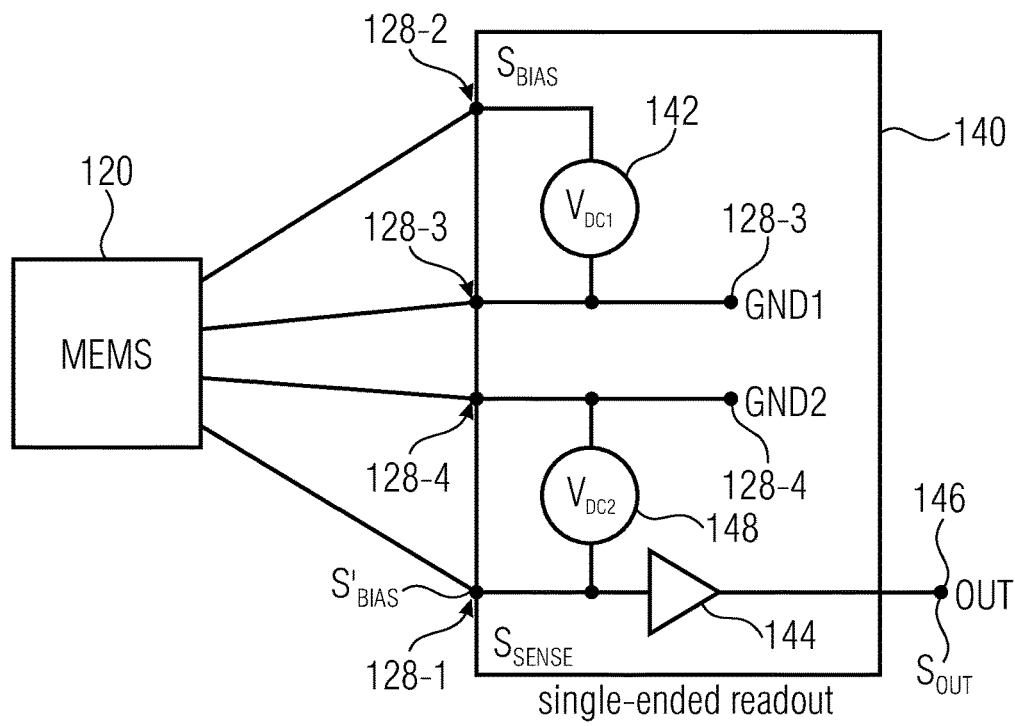
FIGS. 7a-7b, show exemplary schematic illustrations of the MEMS device in a single-ended readout configuration according to embodiments.
Figure 7B:
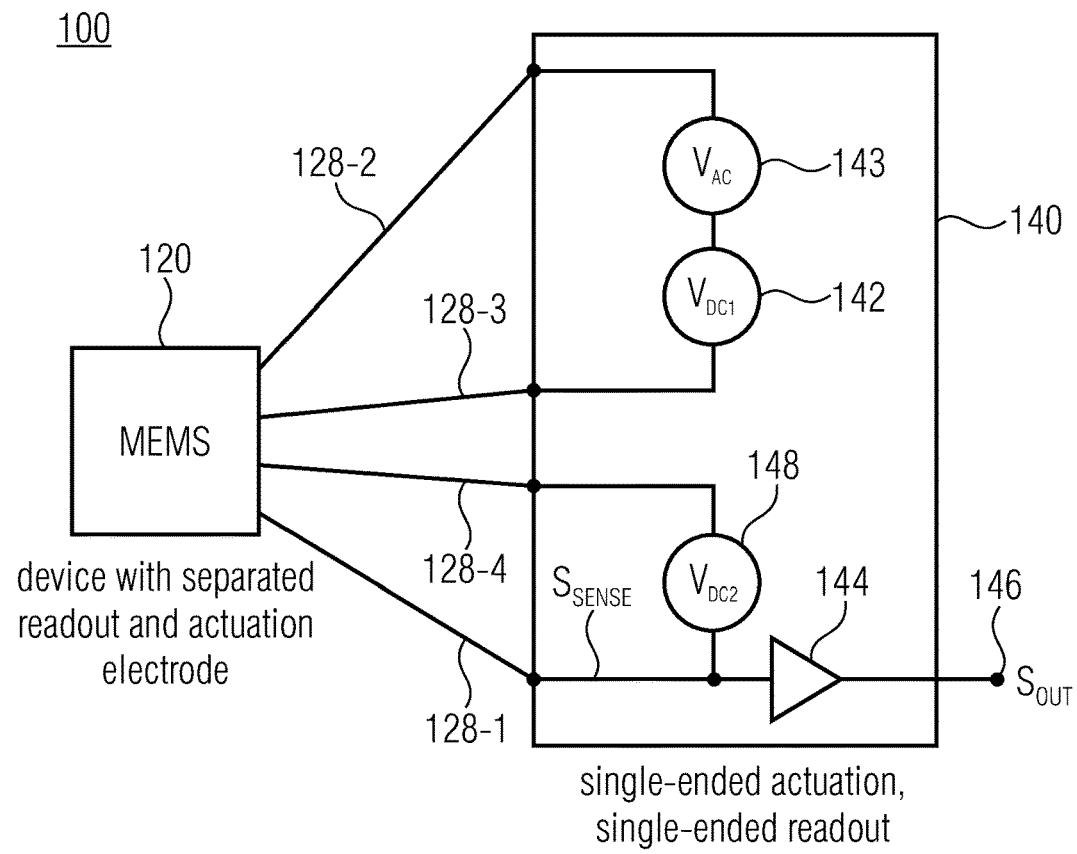

FIGS. 7a-7b, show exemplary schematic illustrations of the MEMS device 100 in a single-ended readout configuration according to a further embodiments.

As shown in FIG. 7a, the control circuitry 140 is connected to the first, second, third and fourth terminal 128-1, 128-2, 128-3, 128-4 of the piezoelectric transducer 120, wherein the first terminal 128-1 forms a sense and control terminal, the second terminal 128-2 forms a bias terminal, the third terminal 128-3 forms a (first) reference terminal (which is connected to a reference potential $GND_1$, e.g. ground potential) of the piezoelectric transducer 120, and the fourth terminal 128-4 forms a (second) reference terminal (which is connected to a further (second) reference potential $GND_2$, e.g. ground potential) of the piezoelectric transducer 120. The control circuitry 140 comprises the voltage source 142 for providing the bias signal (bias voltage) $S_{BIAS}$ (=$V_{DC1}$) with respect to a first reference potential, e.g. ground $GND_1$, to the second terminal 128-2 of the piezoelectric transducer 120, wherein the second terminal 128-2 is connected to the piezoelectric trimming region(s) TR of the piezoelectric transducer 120. The (first) voltage source 142 ($V_{DC1}$) is connected between the second and third terminal 128-2, 128-3 of the piezoelectric transducer 120. Thus, the control circuitry 140 is configured to adjust the second frequency behavior (=target behavior) of the piezoelectric transducer 120 by providing the bias signal S, e.g. the DC bias voltage V, to the piezoelectric trimming region TR of the piezoelectric transducer 120.

The control circuitry 140 comprises a further voltage source 148 for providing a further bias signal (bias voltage) $S'_{BIAS}$ (=$V_{DC2}$) with respect to a second reference potential, e.g. ground $GND_2$, to the first terminal 128-1 of the piezoelectric transducer 120. The further (second) voltage source 148 ($V_{DC2}$) is connected between the first and fourth terminal 128-1, 128-4 of the piezoelectric transducer 120. Thus, the control circuitry 140 is also configured to adjust the second frequency behavior (=target behavior) of the piezoelectric transducer 120 by providing the further bias signal $S'_{BIAS}$, e.g. the DC bias voltage $V_{DC2}$, to the piezoelectric transducer 120. The control bias voltages are applied between the readout electrodes and between the control electrodes.

According to an embodiment, the terminals 128-3, 128-4 (ground terminals) may be formed as separate ground terminals 128-3, 128-4. Thus, a separated ground connection (e.g., with different reference potentials $GND_1$ and $GND_2$) can be provided for the control electronics and the sense electronics.

According to a further embodiment, the terminals 128-3, 128-4 (ground terminals) may be connected to the same reference potential ($GND_1$=$GND_2$) or the terminals 128-3, 128-4 (ground terminals) may be formed as a common (reference) terminal. Thus, a common ground connection (with $GND_1$=$GND_2$) can be provided for the control electronics and the sense electronics.

According to the embodiment of FIG. 7a, the device 100 trimming can be performed by applying a bias signal $V_{DC2}$ between the sensing electrodes 128-1, 128-4 or by applying a bias signal $V_{DC1}$ between the control electrodes 128-2, 128-3 or both (=by applying the bias signal $V_{DC2}$ between the sensing electrodes 128-1, 128-4 and by applying the bias signal $V_{DC1}$ between the control electrodes 128-2, 128-3). Thus, the bias signal $V_{DC2}$ is used as trimming signal on the same piezo-region where the sensor signal $S_{SENSE}$ is generated. The bias signal $V_{DC}$ is applied between the control electrodes only.

Further, the first terminal (output terminal) 128-1 of the piezoelectric transducer 120 is connected to a signal buffer 144 of the control circuitry 140 for providing the output signal $S_{OUT}$ of the MEMS device 100 (e.g., in a single-ended readout configuration) to the output terminal 146. The signal level of the output signal Sour at the output terminal 146 may be related to a reference potential GND, e.g. ground potential.

According to an embodiment, the piezoelectric transducer 120 may be implemented as a piezoelectric sensor for conducting a sensor operation.

According to the approach as shown in FIG. 7b, the piezoelectric MEMS device 100 may be implemented as a piezoelectric MEMS actor based on the piezoelectric effect, wherein the MEMS device 100 uses a AC voltage $V_{AC}$ for operating and driving the piezoelectric MEMS transducer 120 and, also, uses a bias voltage $S_{BIAS}$ ($V_{DC1}$) which is applied between the driving electrodes 128-2, 128-3 of the piezoelectric MEMS transducer 120 for adjusting the target behavior of the frequency response of the piezoelectric transducer 120.

The control circuitry 140 comprises a further voltage source 148 for providing a further bias signal (bias voltage) $S'_{BIAS}$ (=$V_{DC2}$) between the first and fourth terminal 128-1, 128-4 of the piezoelectric transducer 120. Thus, the control circuitry 140 is also configured to adjust the second frequency behavior (=target behavior) of the piezoelectric transducer 120 by providing the further bias signal $S'_{BIAS}$, e.g. the DC bias voltage $V_{DC2}$, to the piezoelectric transducer 120. Thus, the MEMS device 100 has separated readout and actuation electrode for providing a single-ended actuation and a single-ended readout.

According to the embodiment of FIG. 7b, the device 100 trimming can be performed by applying a bias signal $V_{DC2}$ between the sensing electrodes 128-1, 128-4 or by applying a bias signal $V_{DC1}$ between the control electrode or both (=by applying the bias signal $V_{DC2}$ between the sensing electrodes 128-1, 128-4 and by applying the bias signal $V_{DC1}$ on the control electrode). Thus, the bias signal $V_{DC2}$ is used as trimming signal on the same piezo-region where the sensor signal $S_{SENSE}$ is generated. The bias signal $V_{DC1}$ is applied between the control electrodes only.

Further, the first terminal (output terminal) 128-1 of the piezoelectric transducer 120 is connected to a signal buffer 144 of the control circuitry 140 for providing the output signal Sour of the MEMS device 100 (e.g., in a single-ended readout configuration) to the output terminal 146. The signal level of the output signal Sour at the output terminal 146 may be related to a reference potential GND, e.g. ground potential.

According to an embodiment, the piezoelectric transducer 120 may be implemented as a piezoelectric sensor for conducting a sensor operation.

FIGS. 8a-8b show exemplary schematic illustrations of the MEMS device 100 in a differential readout configuration according to embodiments. Thus, FIG. 8a shows a schematic equivalent circuit of the MEMS device 100 having the piezoelectric MEMS transducer 120 and the control circuitry 14o, wherein FIG. 8b shows an exemplary technical implementation of the piezoelectric MEMS transducer 120.

As shown in FIGS. 8a-8b, the control circuitry 140 is connected to the first, second and third terminal 128-1, 128-2, 128-3 of the piezoelectric transducer 120. The control circuitry 140 comprises the voltage source 142 for providing the bias signal (bias voltage) $S_{BIAS}$ (=$V_{DC1}$) to the piezoelectric transducer 120. The voltage source 142 $V_{DC}$ is connected between the second and third terminal 128-2, 128-3 of the piezoelectric transducer 120. The control circuitry 140 comprises a further voltage source 148 for providing a further bias signal (bi-as voltage) $S'_{BIAS}$ (=$V_{DC2}$) between the first and third terminal 128-1, 128-3 of the piezoelectric transducer 120. The control bias voltages are applied between the readout electrodes.

According to the embodiment of FIGS. 8a-8b, the device 100 trimming can be performed by applying a bias signal $V_{DC2}$ between the sensing electrodes 128-1, 128-3 or by applying a bias signal $V_{DC1}$ between the control electrodes 128-2, 128-3 or both (=by applying the bias signal $V_{DC2}$ between the sensing electrodes 128-1, 128-3 and by applying the bias signal $V_{DC1}$ between the control electrodes 128-2, 128-3). Thus, the bias signal $V_{DC2}$ is used as trimming signal on the same piezo-region where the sensor signal $S_{SENSE}$ is generated. The bias signal $V_{DC1}$ is applied between the control electrodes only.

Further, the first terminal (output terminal) 128-1 of the piezoelectric transducer 120 is connected to a signal buffer 144 of the control circuitry 140 for providing the output signal $S_{OUT}$ of the MEMS device 100 to the output terminal 146. Further, the second terminal 128-2 of the piezoelectric transducer 120 is connected to a further signal buffer 145 of the control circuitry 140 for providing a further output signal Spur of the MEMS device 100 (e.g., in a differential readout configuration) to the further output terminal 147.

According to an embodiment, the piezoelectric transducer 120 may be implemented as a piezoelectric sensor for conducting a sensor operation.

Additional embodiments and aspects are described which may be used alone or in combination with the features and functionalities described herein.

According to an embodiment, a MEMS device comprises a piezoelectric transducer having a first frequency behavior, wherein the piezoelectric transducer comprises a piezoelectric trimming region, and a control circuitry configured to provide a bias signal to the piezoelectric trimming region of the piezoelectric transducer for adjusting a second frequency behavior of the piezoelectric transducer.

According to an embodiment, the piezoelectric transducer comprises a piezoelectric transducing element, wherein at least a part of the piezoelectric transducing element forms the piezoelectric trimming region.

According to an embodiment, the piezoelectric transducer has a membrane structure, wherein the piezoelectric transducing element (126) is fixed to or form the membrane structure.

According to an embodiment, the piezoelectric transducer comprises a piezoelectric transducing element and a further piezoelectric transducing element, which is electrically separated from the piezoelectric transducing element, wherein the further piezoelectric transducing element forms the piezoelectric trimming region.

According to an embodiment, the piezoelectric transducer has a membrane structure, wherein the piezoelectric transducing element and the further piezoelectric transducing element are fixed to or form the membrane structure.

According to an embodiment, the piezoelectric transducing element and the further piezoelectric transducing element form the piezoelectric trimming region.

According to an embodiment, the control circuitry is configured to provide the bias signal to the piezoelectric trimming region for adjusting the second frequency behavior by introducing mechanical stress or strain in the piezoelectric trimming region of the piezoelectric transducer.

According to an embodiment, the piezoelectric transducing element comprises a membrane structure, and wherein the piezoelectric trimming region comprises a flap element in the membrane structure, and wherein the flap element can be deflected by means of the bias signal between a first position and a second position.

According to an embodiment, the first frequency behavior is a first frequency response of the piezoelectric transducer and the second frequency behavior is a second frequency response of the piezoelectric transducer, wherein the frequency response of the piezoelectric transducer comprises the sensitivity, the LFRO (low-frequency roll-off) and/or a resonance of the piezoelectric transducer.

According to an embodiment, the first and second frequency response of the piezoelectric transducer comprises at least one of the sensitivity, the LFRO (low-frequency roll-off), a resonance, a total harmonic distortion (THD) and the acoustic overload point (AOP) of the piezoelectric transducer.

According to an embodiment, the control circuitry is configured to provide the bias signal to a readout contact of the piezoelectric transducer.

According to an embodiment, the piezoelectric transducer comprises a pair of contacts, wherein the control circuitry is configured to provide the bias signal between the pair of contacts.

According to an embodiment, the piezoelectric transducer comprises a further pair of contacts, wherein the control circuitry is configured to provide further bias signal between the further pair of contacts.

According to an embodiment, the control circuitry is configured to provide the bias signal as a DC signal to the piezoelectric electric trimming region of the piezoelectric transducer.

According to an embodiment, the control circuitry is configured to set the DC signal for meeting a calibration target of the piezoelectric transducer.

According to an embodiment, the control circuitry is configured to provide the bias signal as a constant DC signal during the operation of the piezoelectric transducer.

According to an embodiment, the control circuitry is configured to adapt the bias signal during the operation of the piezoelectric transducer based on an environmental parameter for adapting the second frequency behavior of the piezoelectric transducer in response to the environmental parameter.

Additional embodiments and aspects are described which may be used alone or in combination with the features and functionalities described herein.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Depending on certain implementation requirements, embodiments of the control circuitry can be implemented in hardware or in software or at least partially in hardware or at least partially in software. Generally, embodiments of the control circuitry can be implemented as a computer program product with a program code, the program code being operative for performing one of the methods when the computer program product runs on a computer. The program code may for example be stored on a machine readable carrier.

In the foregoing detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus, the following claims are hereby incorporated into the detailed description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A microelectronic mechanical system (MEMS) device comprising:
   a piezoelectric transducer having a first frequency behavior, wherein the piezoelectric transducer comprises a piezoelectric trimming region, and
   a control circuitry configured to provide a bias signal to the piezoelectric trimming region of the piezoelectric transducer for adjusting a second frequency behavior of the piezoelectric transducer,
   wherein the piezoelectric transducer has a membrane structure forming a layer, wherein the piezoelectric trimming region is located within the membrane structure in the same layer as the piezoelectric transducer and at least one piezoelectric transducing element is located within the membrane structure in the layer, and
   wherein the piezoelectric trimming region comprises a flap element in the membrane structure, and wherein the flap element is configured to be deflected by the bias signal between a first position and a second position for adjusting the second frequency behavior.

2. The MEMS device of claim 1, wherein the piezoelectric transducer comprises only one piezoelectric transducing element, wherein at least a part of the piezoelectric transducing element forms the piezoelectric trimming region.

3. The MEMS device of claim 2, wherein the piezoelectric transducing element is fixed to or forms the membrane structure.

4. The MEMS device of claim 1, wherein the piezoelectric transducer comprises a piezoelectric transducing element and a further piezoelectric transducing element, wherein the further piezoelectric transducing element forms the piezoelectric trimming region.

5. The MEMS device of claim 4, wherein the piezoelectric transducing element and the further piezoelectric transducing element are fixed to or form the membrane structure.

6. The MEMS device of claim 4, wherein at least a portion of the piezoelectric transducing element and at least a portion of the further piezoelectric transducing element form the piezoelectric trimming region.

7. The MEMS device of claim 1, wherein the control circuitry is configured to provide the bias signal to the piezoelectric trimming region for adjusting the second frequency behavior by introducing mechanical stress or strain in the piezoelectric trimming region of the piezoelectric transducer.

8. The MEMS device of claim 1, wherein the first frequency behavior is a first frequency response of the piezoelectric transducer and the second frequency behavior is a second frequency response of the piezoelectric transducer, wherein a frequency response of the piezoelectric transducer comprises one of a sensitivity, a LFRO (low-frequency roll-off)or a resonance of the piezoelectric transducer.

9. The MEMS device of claim 8, wherein the first frequency response and the second frequency response of the piezoelectric transducer comprise at least one of a sensitivity, a LFRO (low-frequency roll-off), a resonance, a total harmonic distortion or an acoustic overload point of the piezoelectric transducer.

10. The MEMS device of claim 1, wherein the control circuitry is configured to provide the bias signal to a readout contact of the piezoelectric transducer.

11. The MEMS device of claim 1, wherein the piezoelectric transducer comprises a pair of contacts, wherein the control circuitry is configured to provide the bias signal between the pair of contacts.

12. The MEMS device of claim 11, wherein the piezoelectric transducer comprises a further pair of contacts, wherein the control circuitry is configured to provide further bias signal between the further pair of contacts.

13. The MEMS device of claim 1, wherein the control circuitry is configured to provide the bias signal as a DC signal to a piezoelectric electric trimming region of the piezoelectric transducer.

14. The MEMS device of claim 13, wherein the control circuitry is configured to set the DC signal for meeting a calibration target of the piezoelectric transducer.

15. The MEMS device of claim 1, wherein the control circuitry is configured to provide the bias signal as a constant DC signal during operation of the piezoelectric transducer.

16. The MEMS device of claim 1, wherein the control circuitry is configured to adapt the bias signal during operation of the piezoelectric transducer based on an environmental parameter for adapting the second frequency behavior of the piezoelectric transducer in response to the environmental parameter.

17. A microelectronic mechanical system (MEMS) device comprising:
   a membrane structure forming a layer, the membrane structure forming a piezoelectric transducer having a first frequency behavior, wherein the piezoelectric transducer comprises a piezoelectric trimming region, wherein the piezoelectric trimming region is located within the membrane structure and is within the layer, the piezoelectric trimming region comprising a flap element in the membrane structure, and wherein the flap element is configured to deflect in response to a bias signal between a first position and a second position for adjusting a second frequency behavior;
   a control circuitry configured to provide the bias signal to the piezoelectric trimming region of the piezoelectric transducer for adjusting the second frequency behavior of the piezoelectric transducer; and
   at least one piezoelectric transducing element included with the piezoelectric transducer.

18. The MEMS device of claim 17, wherein the control circuitry is configured to provide the bias signal to the piezoelectric trimming region for adjusting the second frequency behavior by introducing mechanical stress or strain in the piezoelectric trimming region of the piezoelectric transducer.

19. The MEMS device of claim 17, wherein the flap element deflects in response to the bias signal to multiple positions, including the first position and the second position, for adjusting the second frequency behavior.

20. A method of forming a microelectronic mechanical system (MEMS) device, the method comprising:
   forming a membrane structure as a first planar layer, the membrane structure comprising a piezoelectric transducer having a first frequency behavior, wherein the piezoelectric transducer comprises a piezoelectric trimming region forming a portion of the membrane structure and located in the first planar layer, including forming a flap element in the piezoelectric trimming region in the membrane structure, wherein the flap element deflects in response to a bias signal between a first position and a second position for adjusting a second frequency behavior;
   coupling a control circuitry to the piezoelectric trimming region of the piezoelectric transducer, the control circuitry configured to provide the bias signal for adjusting the second frequency behavior of the piezoelectric transducer; and
   forming at least one piezoelectric transducing element within the piezoelectric transducer.

* * * * *